United States Patent
Han et al.

(10) Patent No.: US 12,514,073 B2
(45) Date of Patent: Dec. 30, 2025

(54) DISPLAY PANEL AND DISPLAY APPARATUS

(71) Applicants: Beijing BOE Technology Development Co., Ltd., Beijing (CN); BOE Technology Group Co., Ltd., Beijing (CN)

(72) Inventors: Ying Han, Beijing (CN); Pan Xu, Beijing (CN); Xing Zhang, Beijing (CN); Chengyuan Luo, Beijing (CN); Guangshuang Lv, Beijing (CN); Donghui Zhao, Beijing (CN); Tong Wu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 23 days.

(21) Appl. No.: 18/686,438

(22) PCT Filed: May 23, 2023

(86) PCT No.: PCT/CN2023/095870
§ 371 (c)(1),
(2) Date: Feb. 26, 2024

(87) PCT Pub. No.: WO2024/113712
PCT Pub. Date: Jun. 6, 2024

(65) Prior Publication Data
US 2025/0255103 A1 Aug. 7, 2025

(30) Foreign Application Priority Data
Nov. 28, 2022 (WO) .............. PCT/CN2022/134711

(51) Int. Cl.
H10K 59/124 (2023.01)
G09G 3/3225 (2016.01)
(Continued)

(52) U.S. Cl.
CPC ........ H10K 59/124 (2023.02); G09G 3/3225 (2013.01); G09G 3/3258 (2013.01);
(Continued)

(58) Field of Classification Search
CPC ................ H10K 59/35; H10K 59/771; G09G 2300/0413; G09G 2300/0426
See application file for complete search history.

(56) References Cited

U.S. PATENT DOCUMENTS 10,984,723 B1  4/2021  Zhou et al.
11,657,756 B2 * 5/2023  Wang .................. G09G 3/3233
                                                                 345/690
(Continued)

FOREIGN PATENT DOCUMENTS

CN   102566112 A   7/2012
CN   103329637 A   9/2013
(Continued)

OTHER PUBLICATIONS

International Search Report and Written Opinion mailed on Aug. 17, 2023, in corresponding PCT/CN2022/134711, 17 pages.
(Continued)

*Primary Examiner* — Van N Chow
(74) *Attorney, Agent, or Firm* — XSENSUS LLP

(57) ABSTRACT

Disclosed is a display panel. The display panel includes a substrate, a first electrode layer, a pixel defining layer, a light-emitting layer, a second electrode layer, and a peripheral conductive structure. When the light-emitting layer is formed through an ink-jet printing process, an organic solution may be printed into auxiliary dummy openings in an initial printing phase, and then printed into effective pixel openings after printing becomes stable.

20 Claims, 11 Drawing Sheets

(51) Int. Cl.
  *G09G 3/3258* (2016.01)
  *G09G 3/3266* (2016.01)
  *H10K 59/122* (2023.01)
  *H10K 59/131* (2023.01)
  *H10K 59/88* (2023.01)
  *G09G 3/00* (2006.01)

(52) U.S. Cl.
  CPC ......... *G09G 3/3266* (2013.01); *H10K 59/122* (2023.02); *H10K 59/131* (2023.02); *H10K 59/88* (2023.02); *G09G 3/003* (2013.01); *G09G 2300/0408* (2013.01); *G09G 2300/0413* (2013.01); *G09G 2300/0426* (2013.01); *G09G 2300/0465* (2013.01); *G09G 2300/0804* (2013.01); *G09G 2300/0819* (2013.01); *G09G 2300/0842* (2013.01); *G09G 2300/0852* (2013.01); *G09G 2320/0233* (2013.01)

(56) References Cited

U.S. PATENT DOCUMENTS

| | | | |
|---|---|---|---|
| 2013/0099238 A1 | 4/2013 | Chen et al. | |
| 2015/0187810 A1 | 7/2015 | Lee | |
| 2016/0284784 A1 | 9/2016 | Lee et al. | |
| 2018/0069194 A1 | 3/2018 | Ono et al. | |
| 2018/0212008 A1 | 7/2018 | Tang | |
| 2019/0005868 A1 | 1/2019 | Xiao et al. | |
| 2019/0305221 A1 | 10/2019 | Hou | |
| 2020/0043949 A1 | 2/2020 | Lee et al. | |
| 2020/0105799 A1 | 4/2020 | Yuan | |
| 2021/0175281 A1 | 6/2021 | Choi | |
| 2021/0175459 A1 | 6/2021 | Lee et al. | |
| 2021/0225974 A1 | 7/2021 | Zeng et al. | |
| 2021/0376037 A1 | 12/2021 | You | |
| 2021/0407402 A1 | 12/2021 | Xu et al. | |
| 2021/0407407 A1 | 12/2021 | Zhou et al. | |
| 2022/0006011 A1 | 1/2022 | Weng et al. | |
| 2022/0020827 A1* | 1/2022 | Liu | H10K 59/80516 |
| 2022/0059517 A1 | 2/2022 | Ikeda et al. | |
| 2022/0077262 A1 | 3/2022 | Shin et al. | |
| 2022/0123068 A1* | 4/2022 | Zheng | H10K 59/88 |
| 2022/0216183 A1 | 7/2022 | Wang et al. | |
| 2022/0254841 A1 | 8/2022 | Zuo et al. | |
| 2022/0293715 A1* | 9/2022 | Du | H10K 59/131 |
| 2022/0328596 A1 | 10/2022 | Li | |
| 2022/0328611 A1* | 10/2022 | Lu | H10K 59/80522 |
| 2022/0376007 A1 | 11/2022 | Wang et al. | |
| 2023/0021680 A1 | 1/2023 | Li et al. | |
| 2023/0106276 A1 | 4/2023 | Wang | |
| 2023/0298377 A1 | 9/2023 | Hu | |
| 2023/0298509 A1 | 9/2023 | Liu et al. | |
| 2023/0345783 A1* | 10/2023 | Li | H10K 59/8792 |
| 2024/0032355 A1* | 1/2024 | Ding | H10K 59/124 |
| 2024/0047562 A1* | 2/2024 | Hsin | H10D 30/62 |
| 2024/0161687 A1 | 5/2024 | Li et al. | |
| 2024/0169912 A1 | 5/2024 | Long et al. | |
| 2024/0206226 A1 | 6/2024 | Han et al. | |
| 2024/0251631 A1* | 7/2024 | Zhang | H10K 59/771 |
| 2024/0276817 A1* | 8/2024 | Li | H10K 59/1201 |
| 2024/0405127 A1* | 12/2024 | Hsin | H10D 64/021 |
| 2025/0078749 A1* | 3/2025 | Han | G09G 3/3233 |
| 2025/0113705 A1* | 4/2025 | Wu | H10K 59/1213 |
| 2025/0255103 A1* | 8/2025 | Han | G09G 3/32 |

FOREIGN PATENT DOCUMENTS

| | | |
|---|---|---|
| CN | 104749805 A | 7/2015 |
| CN | 106449705 A | 2/2017 |
| CN | 106654048 A | 5/2017 |
| CN | 106782398 A | 5/2017 |
| CN | 108281476 A | 7/2018 |
| CN | 109119028 A | 1/2019 |
| CN | 208335702 U | 1/2019 |
| CN | 208368508 U | 1/2019 |
| CN | 110211974 A | 9/2019 |
| CN | 110611053 A | 12/2019 |
| CN | 110796961 A | 2/2020 |
| CN | 210429887 U | 4/2020 |
| CN | 111128079 A | 5/2020 |
| CN | 111179838 A | 5/2020 |
| CN | 111653591 A | 9/2020 |
| CN | 111710694 A | 9/2020 |
| CN | 111816119 A | 10/2020 |
| CN | 112071882 A | 12/2020 |
| CN | 112951883 A | 6/2021 |
| CN | 112951892 A | 6/2021 |
| CN | 112992997 A | 6/2021 |
| CN | 113035905 A | 6/2021 |
| CN | 113078174 A | 7/2021 |
| CN | 113725262 A | 11/2021 |
| CN | 113871440 A | 12/2021 |
| CN | 113903785 A | 1/2022 |
| CN | 114141825 A | 3/2022 |
| CN | 114530464 A | 5/2022 |
| CN | 114759046 A | 7/2022 |
| CN | 114792766 A | 7/2022 |
| CN | 114974102 A | 8/2022 |
| CN | 115136317 A | 9/2022 |
| CN | 115732507 A | 3/2023 |
| CN | 115799272 A | 3/2023 |
| CN | 115831976 A | 3/2023 |
| JP | 2010-145446 A | 7/2010 |
| KR | 2018-0047295 A | 5/2018 |
| KR | 2019-0036447 A | 4/2019 |
| KR | 2020-0076191 A | 6/2020 |
| WO | 2018/160019 A2 | 9/2018 |
| WO | 2022/037466 A1 | 2/2022 |
| WO | 2022/082491 A1 | 4/2022 |
| WO | 2022/226846 A1 | 11/2022 |
| WO | 2022/226967 A1 | 11/2022 |
| WO | 2022/252024 A1 | 12/2022 |

OTHER PUBLICATIONS

International Search Report and Written Opinion mailed on May 9, 2024, in corresponding PCT/CN2023/095841, 15 pages.
International Search Report and Written Opinion mailed on Sep. 18, 2023, in corresponding PCT/CN2023/095842, 16 pages.
International Search Report and Written Opinion mailed on Sep. 6, 2023, in corresponding PCT/CN2023/095874, 20 pages.
International Search Report and Written Opinion mailed on Jun. 23, 2023, in corresponding PCT/CN2023/088913, 14 pages.

* cited by examiner

A1

B-B'

DISPLAY PANEL AND DISPLAY APPARATUS

CROSS-REFERENCE TO RELATED APPLICATIONS

The application a U.S. national phase application based on PCT/CN2023/095870, filed on May 23, 2023, which claims priority to International Patent Application No. PCT/CN2022/134711, filed on Nov. 28, 2022 and entitled "DISPLAY PANEL AND DISPLAY APPARATUS", all of which are hereby incorporated by reference in their entireties for all purposes.

TECHNICAL FIELD

The present disclosure relates to the field of display technologies, and in particular, relates to a display panel and a display apparatus.

BACKGROUND

An organic light emitting diode (OLED) is regarded as a next-generation display device and has attracted increasing attention in recent years due to its advantages such as self-luminescence, high efficiency, bright color, light weight and thinness, power saving, and crimpability.

SUMMARY

Embodiments of the present disclosure provide a display panel and a display apparatus. The technical solutions are as follows.

In an aspect, the embodiments of the present disclosure provide a display panel. The display panel has a display region and a non-display region at a periphery of the display region, and includes:
  a substrate;
  a first electrode layer on a side of the substrate, wherein the first electrode layer includes a plurality of first electrodes that are independently distributed;
  a pixel defining layer on a side of the first electrode layer distal from the substrate, wherein the pixel defining layer is provided with a plurality of effective pixel openings in the display region and a plurality of auxiliary dummy openings in the non-display region, wherein the plurality of effective pixel openings are in a one-to-one correspondence with the plurality of first electrodes, and an orthographic projection of the effective pixel opening on the substrate falls into an orthographic projection of the corresponding first electrode on the substrate;
  a light-emitting layer, where the light-emitting layer includes effective light-emitting portions in the effective pixel openings and auxiliary dummy portions in the auxiliary dummy openings;
  a second electrode layer on a side of the light-emitting layer distal from the substrate; and
  a peripheral conductive structure in the non-display region, wherein an orthographic projection of the peripheral conductive structure on the substrate overlaps an orthographic projection of the auxiliary dummy opening on the substrate.

Optionally, the plurality of auxiliary dummy openings include a plurality of dummy pixel openings, wherein the dummy pixel opening has a same shape and size as the effective pixel opening.

Optionally, a distribution density of the plurality of dummy pixel openings is a same as a distribution density of the plurality of effective pixel openings.

Optionally, the first electrode layer further includes a plurality of dummy electrodes, wherein the plurality of dummy electrodes are in a one-to-one correspondence with the plurality of dummy pixel openings, and an orthographic projection of the dummy pixel opening on the substrate falls into an orthographic projection of the corresponding dummy electrode on the substrate.

Optionally, the peripheral conductive structure includes a power signal line, wherein an orthographic projection of at least one of the plurality of dummy electrodes on the substrate overlaps an orthographic projection of the power signal line on the substrate.

Optionally, the non-display region includes a first peripheral subregion and a second peripheral subregion, wherein the first peripheral subregion is closer to the display region than the second peripheral subregion, at least a part of the power signal line is in the second peripheral subregion, and the power signal line is outside the first peripheral subregion;
  the plurality of dummy electrodes include a plurality of first dummy sub-electrodes in the first peripheral subregion and a plurality of second dummy sub-electrodes in the second peripheral subregion; and
  the display panel further includes a plurality of dummy pixel circuits that are in a one-to-one correspondence with the plurality of first dummy sub-electrodes, wherein the plurality of dummy pixel circuits are in the first peripheral subregion, and the dummy pixel circuit is insulated from a corresponding first dummy sub-electrode.

Optionally, the display panel further includes a plurality of pixel driving circuits in the display region, and a planarization layer on a side of the plurality of pixel driving circuits and the plurality of dummy pixel circuits distal from the substrate; wherein
  the plurality of pixel driving circuits and the plurality of dummy pixel circuits are in a same layer, and the plurality of pixel driving circuits are in a one-to-one correspondence with the plurality of first electrodes; and
  the dummy pixel circuit is insulated from the corresponding first dummy sub-electrode through the planarization layer, the planarization layer is provided with a plurality of connection vias distributed in the display region, and the pixel driving circuit is electrically connected to a corresponding first electrode through the connection via.

Optionally, the display panel further includes a redundant signal line connected to a row of the dummy pixel circuits, wherein the redundant signal line is distributed in at least the first peripheral subregion; and
  the redundant signal line is electrically connected to the power signal line, or the redundant signal line includes a plurality of redundant electrode blocks that are independently distributed and insulated from each other.

Optionally, the non-display region further includes a third peripheral subregion, wherein the second peripheral subregion is closer to the display region than the third peripheral subregion; and
  the plurality of auxiliary dummy openings further include an auxiliary opening located in the third peripheral subregion; and the peripheral conductive structure further includes a gate driver on array (GOA) circuit and a multiplexer (MUX) circuit that are in the third peripheral subregion, and the plurality of dummy electrodes are all outside the third peripheral subregion.

Optionally, the pixel defining layer includes a first defining sublayer and a second defining sublayer on a side of the first defining sublayer distal from the substrate; and the first defining sublayer is provided with the plurality of effective pixel openings and the plurality of dummy pixel openings, a part of the first defining sublayer located in the third peripheral subregion is a film layer structure disposed as a whole layer, and the second defining sublayer is provided with the auxiliary opening.

Optionally, the second defining sublayer includes a plurality of retaining walls arranged in parallel, wherein the retaining walls are distributed in at least the display region, the first peripheral subregion, and the second peripheral subregion, and each effective light-emitting portion and each auxiliary dummy portion distributed between two adjacent ones of the retaining walls are of a same type.

Optionally, the retaining walls are further distributed in the third peripheral subregion, and parts of two adjacent ones of the retaining walls in the third peripheral subregion are used to define one auxiliary opening.

Optionally, the retaining walls are distributed outside the third peripheral subregion, a part of the second defining sublayer in the third peripheral subregion is provided with a plurality of auxiliary openings arranged in an array, and an arrangement density of the plurality of auxiliary openings is less than or equal to an arrangement density of the plurality of dummy pixel openings.

Optionally, the second defining sublayer further includes a first auxiliary retaining wall, wherein the first auxiliary retaining wall is between the third peripheral subregion and the second peripheral subregion, and an extension direction of the first auxiliary retaining wall intersects an extension direction of the retaining wall.

Optionally, the first peripheral subregion and the third peripheral subregion are distributed around the display region; and the second peripheral subregion is distributed around the display region, or the second peripheral subregion is distributed toward two opposite first sides of the display region, the first side of the display region being a side of the display region adjacent to the GOA circuit.

Optionally, the redundant signal line in the display panel includes a first redundant signal line connected to a row of the dummy pixel circuits and a second redundant signal line connected to a column of the dummy pixel circuits; and the power signal line includes a first power signal line and a second power signal line;

wherein the first power signal line is distributed around the display region, there are two second power signal lines, and the two second power signal lines are distributed toward two opposite second sides of the display region, the second side of the display region being a side of the display region adjacent to the first side; and both ends of the first redundant signal line are electrically connected to the first power signal line; and both ends of the second redundant signal line are electrically connected to the first power signal line, or both ends of the second redundant signal line are electrically connected to the two second power signal lines respectively.

Optionally, the first electrode layer further includes a connection electrode configured to connect two adjacent ones of the dummy electrodes, and the dummy electrodes are electrically connected to the power signal line.

Optionally, the display region includes a plurality of pixel subregions, wherein one of the pixel subregions includes at least two of the effective pixel openings distributed side by side, and the effective light-emitting portions in at least two of the effective pixel openings in one of the pixel subregions are of a same type.

In another aspect, the embodiments of the present disclosure provide a display apparatus, including a power supply assembly and a display panel electrically connected to the power supply assembly, wherein the display panel is the display panel in the above aspect.

Optionally, the display apparatus further includes an optical lens on a light exit side of the display panel, wherein the optical lens is provided with a plurality of microlenses.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art may still derive other drawings from these accompanying drawings without creative efforts.

DETAILED DESCRIPTION

To make the objective, technical solutions, and advantages of the present disclosure clearer, embodiments of the present disclosure will be further described in detail with reference to the accompanying drawings.

An OLED display panel may usually include an anode layer, an organic light-emitting layer, a cathode layer, and the like that are stacked. At present, the organic light-emitting layer in the OLED display panel may be formed through an ink-jet printing technology. When the organic light-emitting layer is manufactured through the ink-jet printing technology, a pixel defining layer needs to be formed on a substrate first. Then, an organic solution in which an organic light-emitting material is dissolved is printed into pixel openings in the pixel defining layer to form the organic light-emitting layer.

However, when the OLED display panel has a high resolution, the pixel openings in the pixel defining layer have a small size. When the organic light-emitting layer is formed through the ink-jet printing technology, the organic solution printed into the pixel openings is likely to be unevenly distributed, resulting in poor uniformity of the subsequently formed organic light-emitting layer. Consequently, a display effect of the OLED display panel is poor.

Figure 1:
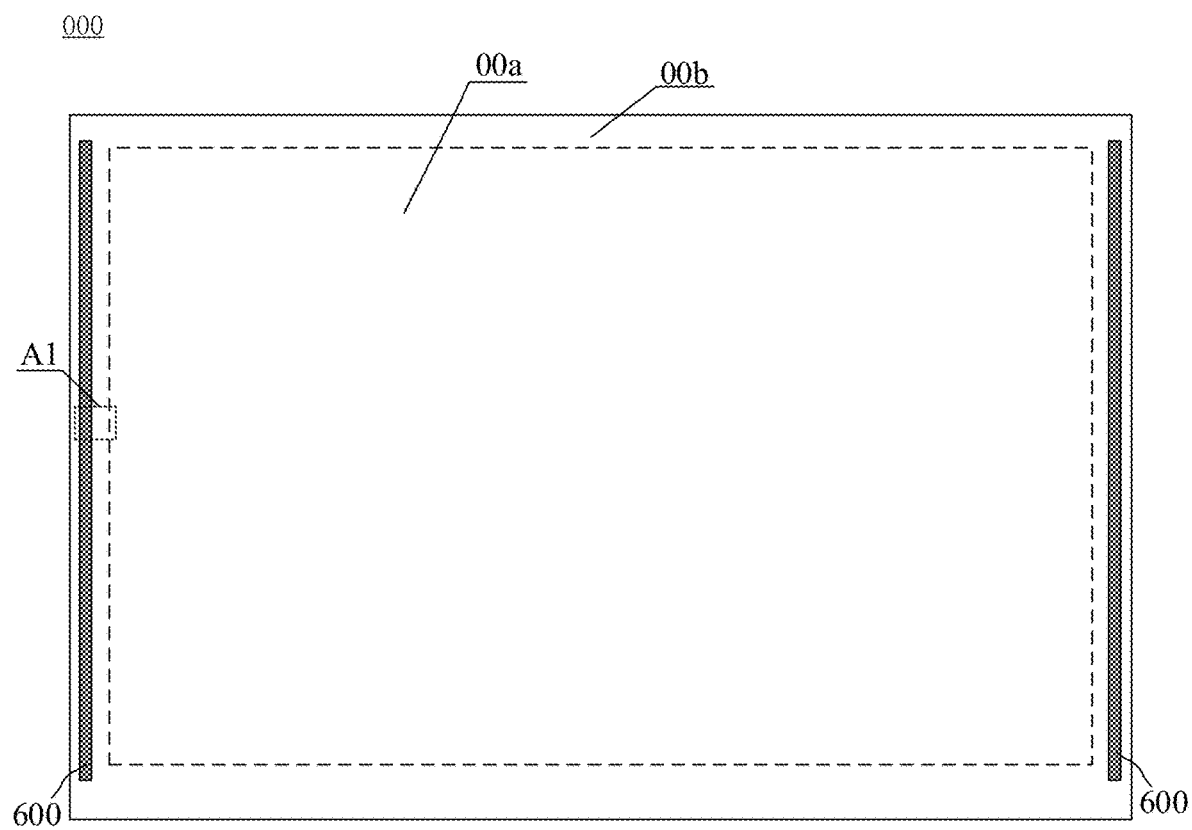
FIG. 1 is a top view of a display panel according to some embodiments of the present disclosure.
Figure 2:
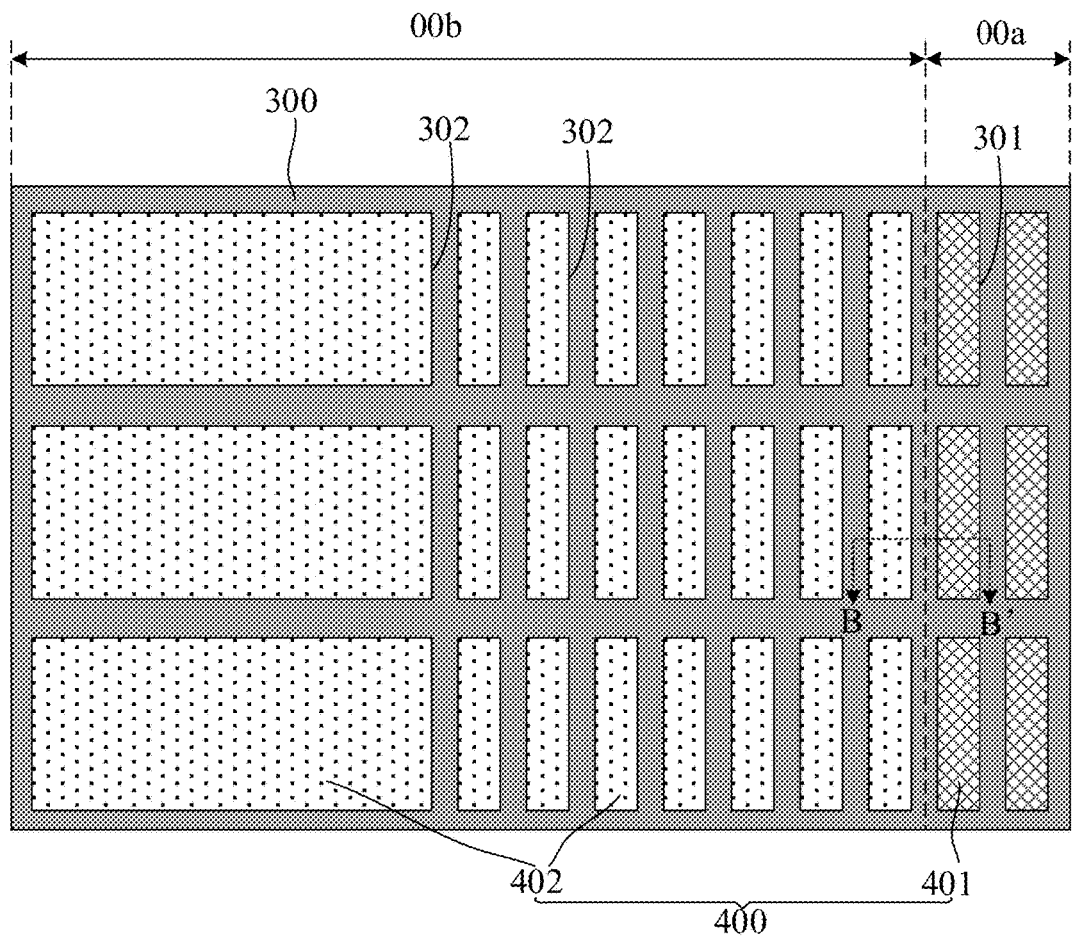
FIG. 2 is a locally enlarged view of the display panel at A1 shown in FIG. 1.
Figure 3:
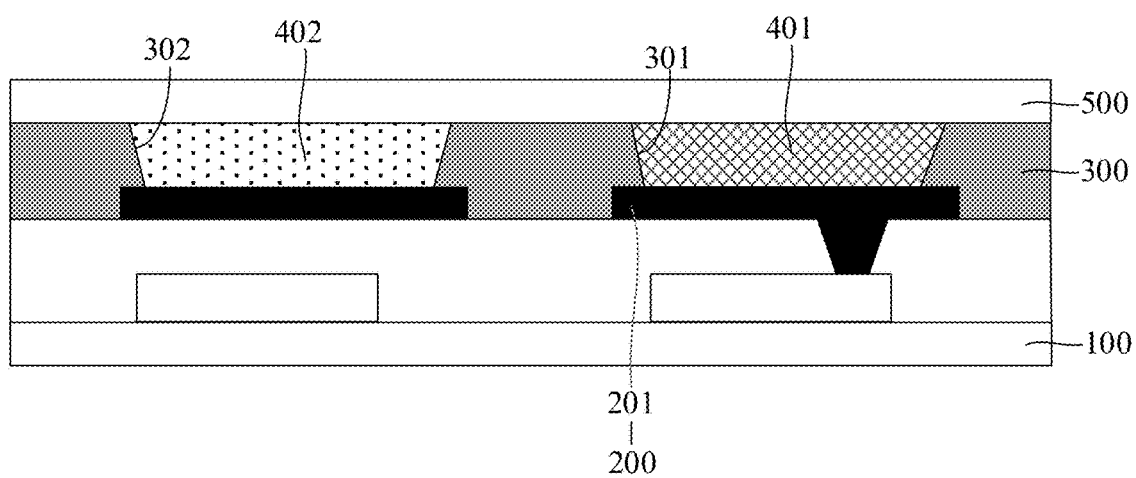
FIG. 3 is a schematic diagram of a film layer structure of the display panel at B-B' shown in FIG. 2.

Refer to FIG. 1, FIG. 2, and FIG. 3. FIG. 1 is a top view of a display panel according to some embodiments of the present disclosure. FIG. 2 is a locally enlarged view of the display panel at A1 shown in FIG. 1. FIG. 3 is a schematic diagram of a film layer structure of the display panel at B-B' shown in FIG. 2. A display panel 000 may have a display region 00a and a non-display region 00b located on at least one side of a periphery of the display region 00a. In a possible implementation, the non-display region 00b of the display panel 000 is an annular region. The non-display region 00b of the display panel 000 may be distributed around the display region 00a. The display panel 000 may include a substrate 100, a first electrode layer 200, a pixel defining layer 300, a light-emitting layer 400, a second electrode layer 500, and a peripheral conductive structure 600.

The first electrode layer 200 in the display panel 000 may be located on a side of the substrate 100. The first electrode layer 200 may include a plurality of first electrodes 201 that are independently distributed. The plurality of first electrodes 201 may be distributed in the display region 00a of the display panel 000. It should be noted that the first electrode layer 200 may also be usually referred to as an anode layer, and the first electrode 201 in the first electrode layer 200 may also be referred to as an anode block.

The pixel defining layer 300 in the display panel 000 may be located on a side of the first electrode layer 200 distal from the substrate 100. The pixel defining layer 300 may be provided with a plurality of effective pixel openings 301 located in the display region 00a and a plurality of auxiliary dummy openings 302 located in the non-display region 00b. The plurality of effective pixel openings 301 in the pixel defining layer 300 may be in a one-to-one correspondence with the plurality of first electrodes 201 in the first electrode layer 200. An orthographic projection of each effective pixel opening 301 on the substrate 100 may fall into an orthographic projection of the corresponding first electrode 201 on the substrate 100.

The light-emitting layer 400 in the display panel 000 may include effective light-emitting portions 401 located in the effective pixel openings 301 and auxiliary dummy portions 402 located in the auxiliary dummy openings 302. In the present disclosure, the light-emitting layer 400 in the display panel 000 may be formed through an ink-jet printing process. For example, when the light-emitting layer 400 is formed through the ink-jet printing process, an organic solution in which an organic light-emitting material is dissolved may be sequentially printed into the auxiliary dummy openings 302 and the effective pixel openings 301 of the pixel defining layer 300 by using a printhead. After the organic solution in the auxiliary dummy openings 302 is solidified, the auxiliary dummy portions 402 can be formed in the auxiliary dummy openings 302. After the organic solution in the effective pixel openings 301 is solidified, the effective light-emitting portions 401 can be formed in the effective pixel openings 301.

The second electrode layer 500 in the display panel 000 may be located on a side of the light-emitting layer 400 distal from the substrate 100. The second electrode layer 500 may be a lamellar electrode disposed as a whole layer. It should be noted that the second electrode layer 200 may also be usually referred to as a cathode layer. In the display region 00a of the display panel 000, a part of the first electrode 201 located in the corresponding effective pixel opening 301, the effective light-emitting portion 401 located in the effective pixel opening 301, and a part of the second electrode layer 500 located in the effective pixel opening 301 are used to constitute one light-emitting device. For example, the light-emitting device may be an OLED light-emitting device.

It should also be noted that both sides of the effective light-emitting portion 401 located in the effective pixel opening 301 are electrically connected to the first electrode 201 and the second electrode layer 500 respectively. Therefore, when corresponding signals are applied to the first electrode 201 and the second electrode layer 500, the effective light-emitting portion 401 located between them can emit light outward. For the auxiliary dummy portions 402 distributed in the auxiliary dummy openings 302, the auxiliary dummy portions 402 are not electrically connected to the first electrode 201 or the second electrode layer 500. Therefore, the auxiliary dummy portions 402 do not emit light outward.

The peripheral conductive structure 600 in the display panel 000 may be located in the non-display region 00b of the display panel 000. An orthographic projection of the peripheral conductive structure 600 on the substrate 100 may overlap an orthographic projection of the auxiliary dummy opening 302 on the substrate 100, that is, the orthographic projection of the peripheral conductive structure 600 on the substrate 100 may overlap an orthographic projection of at least one of the auxiliary dummy openings 302, on the substrate 100.

In the embodiments of the present disclosure, after the pixel defining layer 300 in the display panel 000 is formed, the light-emitting layer 400 can be formed through the ink-jet printing process. When the light-emitting layer 400 is formed through the ink-jet printing process, stability of the organic solution printed by the printhead is poor in an initial printing phase. The organic solution with good stability can be printed by the printhead after a specific time of printing. In view of this, the organic solution can be printed into the auxiliary dummy openings 302 in the initial printing phase, and then printed into the effective pixel openings 301 after printing becomes stable. In this way, it can ensure that the organic solution printed into the effective pixel openings 301 is uniform, such that the effective light-emitting portions 401 formed after the organic solution in the effective pixel openings 301 is solidified have good uniformity and the display panel 000 has a good display effect. Although the organic solution printed into the auxiliary dummy openings 302 is not uniform and the auxiliary dummy portions 402 formed after the organic solution is solidified have poor uniformity, the auxiliary dummy portions 402 do not emit light outward and do not affect the display effect of the display panel 000.

In addition, the orthographic projection of the peripheral conductive structure 600 in the display panel 000 on the substrate 100 overlaps the orthographic projection of the auxiliary dummy opening 302 on the substrate 100. Therefore, there is no need for an additional region in which only the auxiliary dummy openings are arranged in the non-display region 00b, such that a width of the non-display region 00b of the display panel 000 is small and a narrow frame of the display panel 000 can be achieved.

In summary, the display panel provided in the embodiments of the present disclosure includes the substrate, the first electrode layer, the pixel defining layer, the light-emitting layer, the second electrode layer, and the peripheral conductive structure. When the light-emitting layer is formed through the ink-jet printing process, the organic solution can be printed into the auxiliary dummy openings in the initial printing phase, and then printed into the effective pixel openings after printing becomes stable. In this way, it can ensure that the organic solution printed into the effective pixel openings is uniform, such that the effective light-emitting portions formed after the organic solution in the effective pixel openings is solidified have good uniformity and the display panel has a good display effect. Although the organic solution printed into the auxiliary dummy openings is not uniform and the auxiliary dummy portions formed after the organic solution is solidified have poor uniformity, the auxiliary dummy portions do not emit light outward and do not affect the display effect of the display panel. In addition, the orthographic projection of the peripheral conductive structure in the display panel on the substrate overlaps the orthographic projection of the auxiliary dummy opening on the substrate. Therefore, there is no need for the additional region in which only the auxiliary dummy openings are arranged in the non-display region, such that the width of the non-display region of the display panel is small and the narrow frame of the display panel can be achieved.

Figure 4:
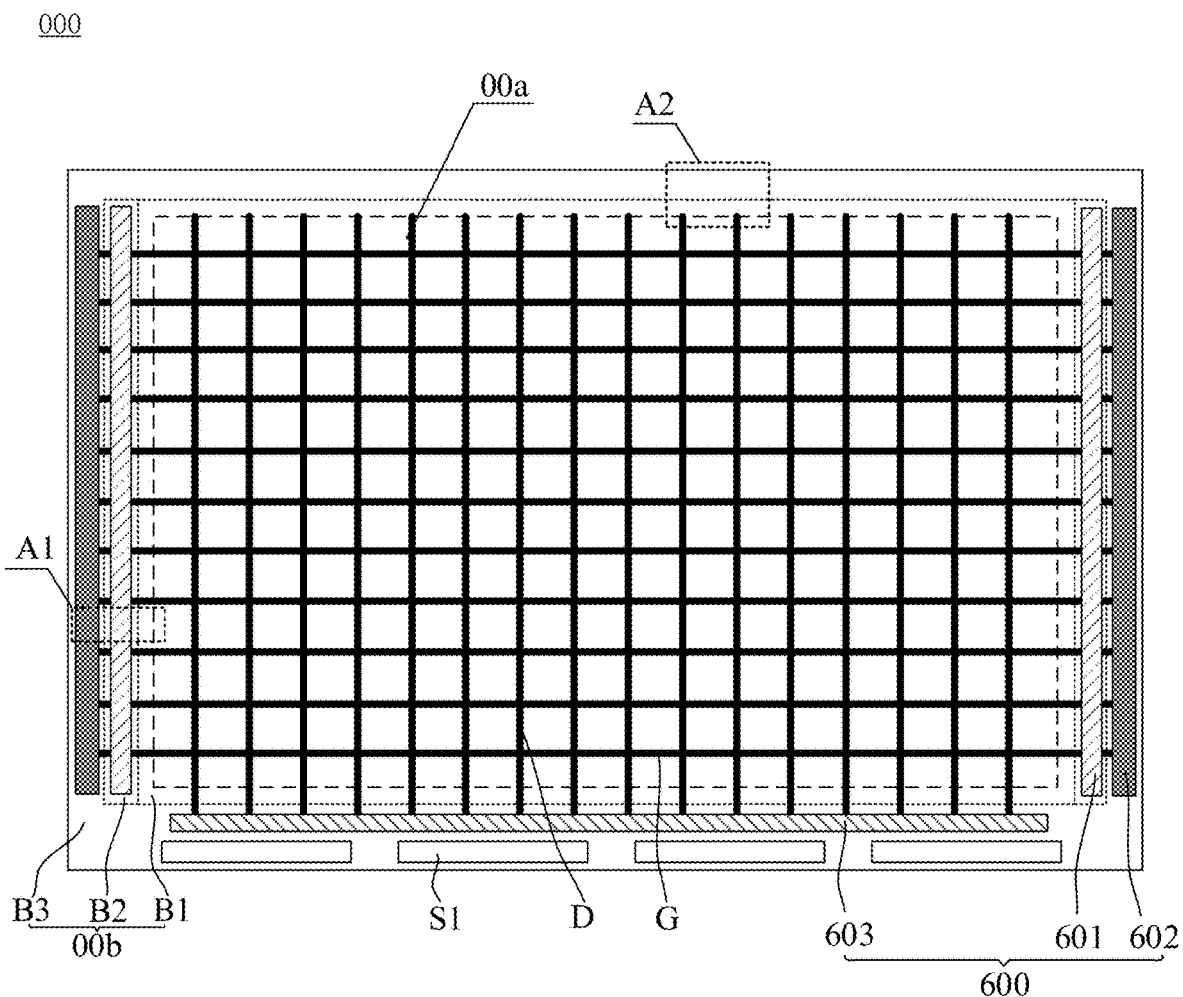
FIG. 4 is a top view of another display panel according to some embodiments of the present disclosure.
Figure 5:
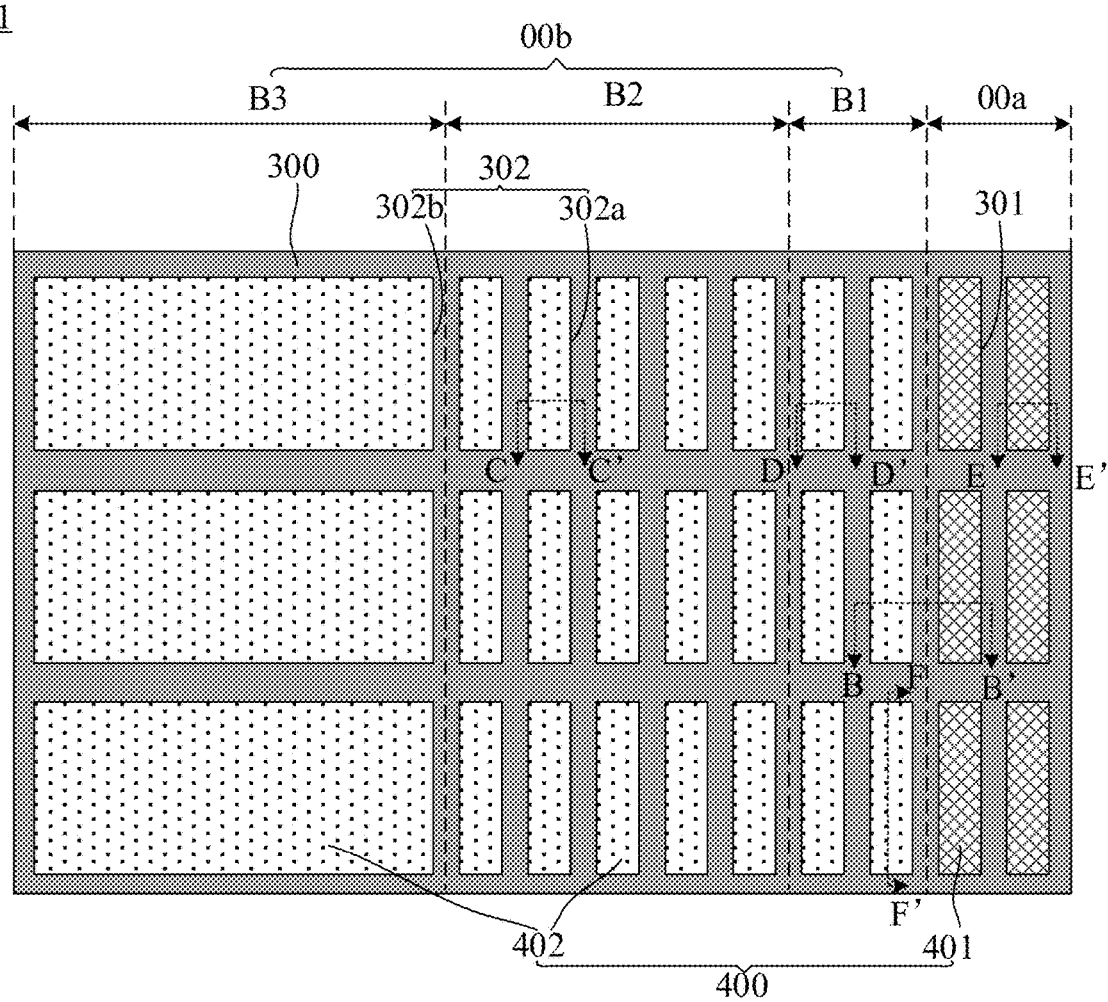
FIG. 5 is a locally enlarged view of the display panel at A1 shown in FIG. 4.

In the embodiments of the present disclosure, as shown in FIG. 4 and FIG. 5, FIG. 4 is a top view of another display panel according to some embodiments of the present disclosure, and FIG. 5 is a locally enlarged view of the display panel at A1 shown in FIG. 4. The plurality of auxiliary dummy openings 302 of the pixel defining layer 300 in the display panel 000 may include a plurality of dummy pixel openings 302a. The dummy pixel opening 302a has a same shape and size as the effective pixel opening 301. Optionally, in the pixel defining layer 300, a distribution density of the plurality of dummy pixel openings 302a is the same as a distribution density of the plurality of effective pixel openings 301. It should be noted that a distribution density of openings in the embodiments of the present disclosure is a quantity of openings distributed per unit area. the distribution density of the plurality of dummy pixel openings 302a being the same as the distribution density of the plurality of effective pixel openings 301 means that a quantity of dummy pixel openings 302a distributed per unit area is the same as a quantity of effective pixel openings 301 distributed per unit area. The unit area may be 1 square inch.

In this case, the distribution of the dummy pixel openings 302a in the pixel defining layer 300 is the same as that of the effective pixel openings 301. Therefore, when the light-emitting layer 400 is formed through the ink-jet printing process, the organic solution may be first printed into the plurality of dummy pixel openings 302a. A flow of the organic solution printed into the plurality of dummy pixel openings 302a gradually stabilizes. When the organic solution is printed into the effective pixel openings 301 with the same distribution as the dummy pixel openings 302a, the organic solution printed into the effective pixel openings 301 can stably flow. In this way, it can further improve uniformity of the organic solution printed into the effective pixel openings 301.

Figure 6:
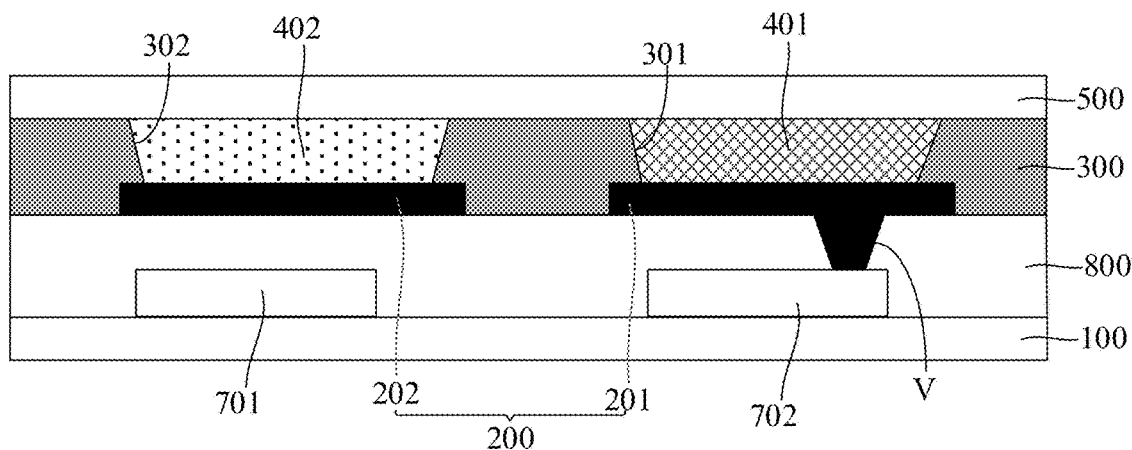
FIG. 6 is a schematic diagram of a film layer structure of the display panel at B-B' shown in FIG. 5.

In the present disclosure, as shown in FIG. 6, FIG. 6 is a schematic diagram of a film layer structure of the display panel at B-B' shown in FIG. 5. The first electrode layer 200 may further include a plurality of dummy electrodes 202. The plurality of dummy electrodes 202 may be in a one-to-one correspondence with the plurality of dummy pixel openings 302a. An orthographic projection of each dummy pixel opening 302a on the substrate 100 may fall into an orthographic projection of the corresponding dummy electrode 202 on the substrate 100.

In this case, a bottom of the organic solution in the effective pixel opening 301 is in contact with the first electrode 201, and a bottom of the organic solution in the dummy pixel opening 302a is in contact with the dummy electrode 202. Both the first electrode 201 and the dummy electrode 202 are parts of the first electrode layer 200. This can ensure that a printing environment when the organic solution is printed into the dummy pixel openings 302a is the same as a printing environment when the organic solution is printed into the effective pixel openings 301. In this way, when the organic solution is printed into the effective pixel openings 301 after the organic solution stably flows in the dummy pixel openings 302a, the organic solution can stably flow into the effective pixel openings 301. This further improves the uniformity of the organic solution printed into the effective pixel openings 301.

Figure 7:
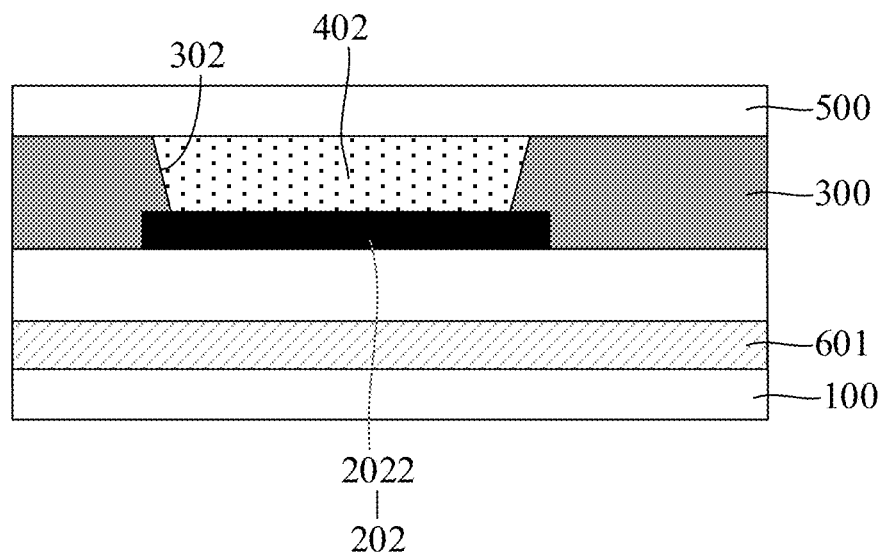
FIG. 7 is a schematic diagram of a film layer structure of the display panel at C-C' shown in FIG. 5.

Optionally, as shown in FIG. 4 and FIG. 7, FIG. 7 is a schematic diagram of a film layer structure of the display panel at C-C' shown in FIG. 5. The peripheral conductive structure 600 in the display panel 000 may include a power signal line 601. In a possible implementation, the dummy electrodes 202 in the first electrode layer 200 are insulated from the power signal line 601. In another possible implementation, the dummy electrodes 202 in the first electrode layer 200 may be electrically connected to the power signal line 601. For an implementation of electrically connecting the dummy electrodes 202 to the power signal line 601, reference may be made to corresponding content in the following embodiments, and details are not described herein.

An orthographic projection of at least one of the plurality of dummy electrodes 202 on the substrate 100 overlaps an orthographic projection of the power signal line 601 on the substrate 100. That is, an orthographic projection of at least one of the plurality of dummy pixel openings 302a in the pixel defining layer 300 on the substrate 100 overlaps the orthographic projection of the power signal line 601 on the substrate 100. In this way, the dummy pixel openings 302a are provided in the pixel defining layer 300 to ensure that the dummy pixel openings 302a do not additionally occupy the non-display region 00b of the display panel 000 on the premise that the organic solution printed into the effective pixel openings 301 is uniform, such that the width of the non-display region 00b of the display panel 000 is small.

In the embodiments of the present disclosure, as shown in FIG. 4 and FIG. 5, the non-display region 00b of the display panel 000 may include a first peripheral subregion B1 and a second peripheral subregion B2. The first peripheral subregion B1 is closer to the display region 00a than the second peripheral subregion B2. At least a part of the power signal line 601 in the peripheral conductive structure 600 may be distributed in the second peripheral subregion B2, and the peripheral conductive structure 600 may be entirely distributed outside the first peripheral subregion B1.

Figure 8:
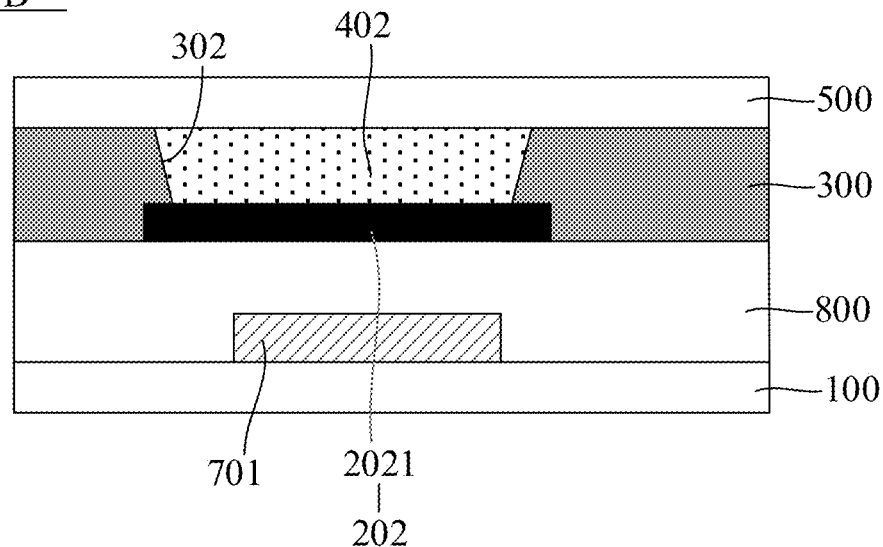
FIG. 8 is a schematic diagram of a film layer structure of the display panel at D-D' shown in FIG. 5.

As shown in FIG. 7 and FIG. 8, FIG. 8 is a schematic diagram of a film layer structure of the display panel at D-D' shown in FIG. 5. The plurality of dummy electrodes 202 in the first electrode layer 200 may include a plurality of first dummy sub-electrodes 2021 located in the first peripheral subregion B1 and a plurality of second dummy sub-electrodes 2022 located in the second peripheral subregion B2. The structure of the first dummy sub-electrode 2021 is the same as that of the second dummy sub-electrode 2022. The dummy pixel openings corresponding to the first dummy sub-electrodes 2021 in the plurality of dummy pixel openings 302a may be distributed in the first peripheral subregion B1. The dummy pixel openings corresponding to the second dummy sub-electrodes 2022 in the plurality of dummy pixel openings 302a may be distributed in the second peripheral subregion B2.

In the embodiments of the present disclosure, as shown in FIG. 6 and FIG. 8, the display panel 000 may further include a plurality of dummy pixel circuits 701 that are in a one-to-one correspondence with the plurality of first dummy sub-electrodes 2021. The plurality of dummy pixel circuits 701 may be located in the first peripheral subregion B1. Each dummy pixel circuit 701 may be insulated from the corresponding first dummy sub-electrode 2021.

In this case, an orthographic projection of the first dummy sub-electrode 2021 in the first electrode layer 200 on the substrate 100 does not overlap the orthographic projection of the power signal line 601 in the peripheral conductive structure 600 on the substrate 100. The orthographic projection of the first dummy sub-electrode 2021 on the substrate 100 may overlap an orthographic projection of the dummy pixel circuit 701 on the substrate 100. An orthographic projection of the second dummy sub-electrode 2022 in the first electrode layer 200 on the substrate 100 overlaps the orthographic projection of the power signal line 601 in the peripheral conductive structure 600 on the substrate 100.

When the first dummy sub-electrode 2021 is insulated from the corresponding dummy pixel circuit 701, the dummy pixel circuit 701 does not apply a drive signal to the first dummy sub-electrode 2021, such that the auxiliary dummy portion 402 in the dummy pixel opening 302a corresponding to the first dummy sub-electrode 2021 does not emit light outward.

Figure 9:
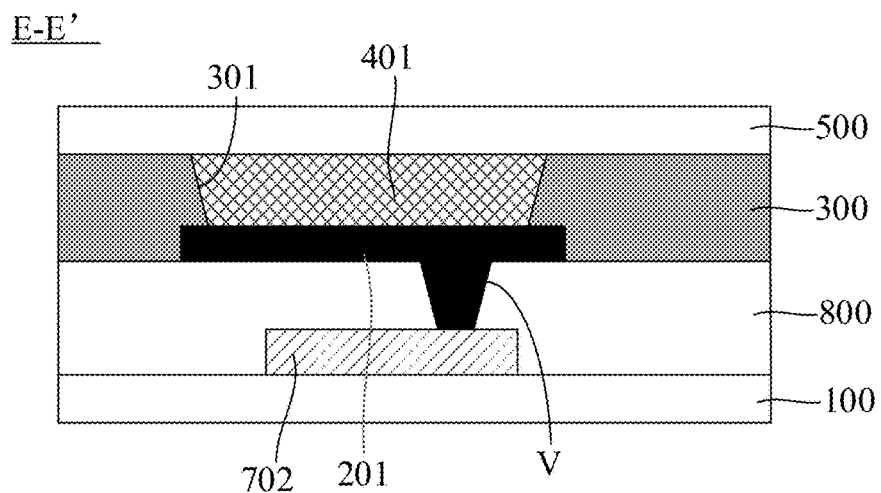
FIG. 9 is a schematic diagram of a film layer structure of the display panel at E-E' shown in FIG. 5.

In the present disclosure, as shown in FIG. 6 and FIG. 9, FIG. 9 is a schematic diagram of a film layer structure of the display panel at E-E' shown in FIG. 5. The display panel 000 may further include a plurality of pixel driving circuits 702 located in the display region 00a. The plurality of pixel driving circuits 702 may be electrically connected to the plurality of first electrodes 201 in the first electrode layer 200 in a one-to-one correspondence. Each pixel driving circuit 702 may apply a drive signal to the corresponding first electrode 201, such that the effective light-emitting portion 401 in the effective pixel opening 301 corresponding to the first electrode 201 can emit light outward. The structure of the pixel driving circuit 702 is the same as that of the dummy pixel circuit 701. In view of this, the plurality of pixel driving circuits 702 may be disposed in a same layer as the plurality of dummy pixel circuits 701. That is, the pixel driving circuits 702 and the dummy pixel circuits 701 can be formed simultaneously through a same process.

Figure 10:
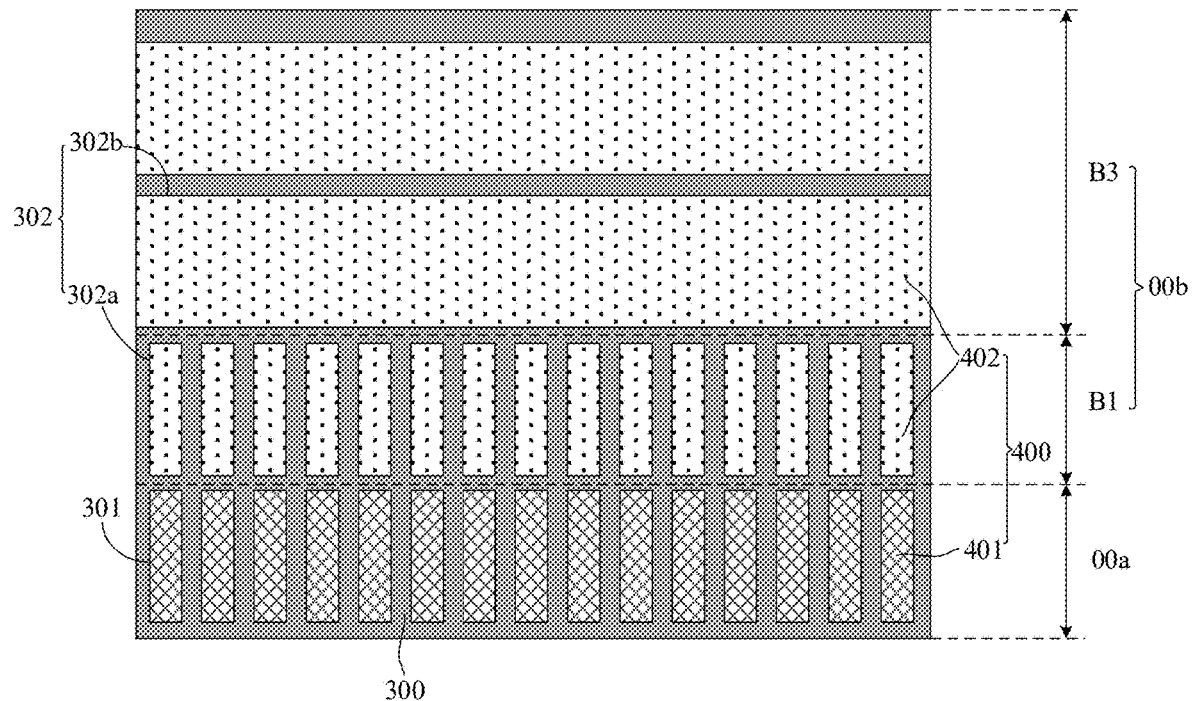
FIG. 10 is a locally enlarged view of the display panel at A2 shown in FIG. 4.

Optionally, as shown in FIG. 4 and FIG. 10, FIG. 10 is a locally enlarged view of the display panel at A2 shown in FIG. 4. The first peripheral subregion B1 in the non-display region 00b may be distributed around the display region 00a. In this way, the plurality of dummy pixel circuits 701 may also be distributed around the display region 00a.

It should be noted that the pixel driving circuit 702 includes a plurality of stacked pattern structures, and the dummy pixel circuit 701 also includes a plurality of stacked pattern structures. A quantity of layers of the pattern structures in the pixel driving circuit 702 is the same as a quantity of layers of the pattern structures in the dummy pixel circuit 701. The pattern structure in the pixel driving circuit 702 and the corresponding pattern structure in the dummy pixel circuit 701 can be formed simultaneously through a same patterning process. When patterning is performed to form the pattern structures, a pattern located at a center has good uniformity, and a pattern located at an edge has poor uniformity. Therefore, after the first peripheral subregion B1 distributed around the display region 00a is disposed and the dummy pixel circuits 701 are disposed in the first peripheral subregion B1, good uniformity of the pattern structures in each pixel driving circuit 702 in the display region 00a can be ensured, and a good effect of applying the drive signal to the corresponding first electrode 201 by the pixel driving circuit 702 is ensured, such that the display effect of the display panel 000 can be further improved. Although the pattern structures in the dummy pixel circuit 701 in the first peripheral subregion B1 have poor uniformity, the dummy pixel circuit 701 does not need to apply a drive signal to the corresponding first dummy sub-electrode 2021 and does not affect the display effect of the display panel 000.

In addition, the first electrode layer 200 in the display panel 000 also needs to be formed through a patterning process. Therefore, after the first peripheral subregion B1 distributed around the display region 00a is disposed and the first dummy sub-electrodes 2021 in the first electrode layer 200 are disposed in the first peripheral subregion B1, good uniformity of the first electrodes 201 in the display region 00a can be ensured, to further improve the display effect of the display panel 000. Similarly, although the first dummy sub-electrode 2021 in the first peripheral subregion B1 has poor uniformity, the first dummy sub-electrode 2021 does not receive a drive signal applied by the corresponding dummy pixel circuit 701 and does not affect the display effect of the display panel 000.

Optionally, as shown in FIG. 6, FIG. 8, and FIG. 9, the display panel 000 may further include a planarization layer 800 located on a side of the plurality of pixel driving circuits 702 and the plurality of dummy pixel circuits 701 distal from the substrate 100. The first electrode layer 200 in the display panel 000 may be located on a side of the planarization layer 800 distal from the substrate 100. A part of the planarization layer 800 located in the display region 00a may be provided with a connection via V. A part of the planarization layer 800 located in the non-display region 00b is not provided with a connection via.

In this case, each first dummy sub-electrode 2021 in the first electrode layer 200 may be insulated from the corresponding dummy pixel circuit 701 through the planarization layer 800. Each first electrode 201 in the first electrode layer 200 may be electrically connected to the corresponding pixel driving circuit 702 through the connection via V.

Optionally, as shown in FIG. 4, FIG. 5, and FIG. 10, the non-display region 00b of the display panel 000 may further include a third peripheral subregion B3. The second peripheral subregion B2 is closer to the display region 00a of the display panel 000 than the third peripheral subregion B3. In other words, a distance from the third peripheral subregion B3 to the display region 00a is long, and distances from the first peripheral subregion B1 and the second peripheral subregion B2 to the display region 00a are short.

The plurality of auxiliary dummy openings 302 in the pixel defining layer 300 may further include an auxiliary opening 302b located in the third peripheral subregion B3. In other words, the plurality of dummy pixel openings 302a in the plurality of auxiliary dummy openings 302 may be distributed in the first peripheral subregion B1 and the second peripheral subregion B2, and the auxiliary opening 302b in the plurality of auxiliary dummy openings 302 may be distributed in the third peripheral subregion B3.

In this case, when the light-emitting layer 400 is formed through printing by using the printhead, initial ink-jet by the printhead is not uniform. Therefore, after the third peripheral subregion B3 that is farther away from the display region 00a is disposed in the non-display region 00b and the auxiliary opening 302b is provided in a part of the pixel defining layer 300 located in the third peripheral subregion B3, the printhead may first print the organic solution into the auxiliary opening 302b, and then print the organic solution into the dummy pixel openings 302a after ink-jet by the printhead becomes uniform, such that the flow of the organic solution in the dummy pixel openings 302a can stabilize faster. This can ensure that a width of the second peripheral subregion B2 does not need to be set to be large, and the flow of the organic solution in the dummy pixel openings 302a can stabilize before the organic solution is printed into the effective pixel openings 301.

In the embodiments of the present disclosure, as shown in FIG. 4, the peripheral conductive structure 600 in the display panel 000 may further include a gate driver on array (GOA) circuit 602 and a multiplexer (MUX) circuit 603 that are located in the third peripheral subregion B3. That is, an orthographic projection of the auxiliary opening 302b on the substrate 100 overlaps an orthographic projection of the GOA circuit 602 on the substrate 100 and an orthographic projection of the MUX circuit 603 on the substrate 100. In this case, the auxiliary opening 302b may be provided in the pixel defining layer 300 to ensure that the auxiliary opening 302b does not additionally occupy the non-display region 00b of the display panel 000 on the premise that the flow of the organic solution in the dummy pixel openings 302a can stabilize faster. This can further reduce the width of the non-display region 00b of the display panel 000.

In the present disclosure, the plurality of dummy electrodes 202 in the first electrode layer 200 are all located outside the third peripheral subregion B3. That is, an orthographic projection of the dummy electrode 202 on the substrate 100 does not overlap the orthographic projection of the auxiliary opening 302b on the substrate 100. In this way, it can ensure that the orthographic projection of the GOA circuit 602 on the substrate 100 does not overlap the orthographic projection of the dummy electrode 202 on the substrate 100, to ensure that no coupling capacitance is generated between the dummy electrode 202 and the GOA circuit 602, such that the dummy electrode 202 does not interfere with normal operation of the GOA circuit 602.

Similarly, it can ensure that the orthographic projection of the MUX circuit 603 on the substrate 100 does not overlap the orthographic projection of the dummy electrode 202 on the substrate 100, to ensure that no coupling capacitance is generated between the dummy electrode 202 and the MUX circuit 603, such that the dummy electrode 202 does not interfere with normal operation of the MUX circuit 603.

It should be noted that the pixel defining layer 300 in the display panel 000 is usually located on the side of the planarization layer 800 distal from the substrate 100. Therefore, when no dummy electrode is distributed in the auxiliary opening 302b, an organic material printed into the auxiliary opening 302b can be in direct contact with the planarization layer 800. The planarization layer 800 is usually made of an organic material. Consequently, the flow of the organic solution in the planarization layer 800 is affected, and a subsequent printing effect may be further affected. To ensure a good effect when the light-emitting layer 400 is formed through the ink-jet printing process, the organic solution printed into the auxiliary opening 302b needs to be in contact with the pixel defining layer 300.

Figure 11:
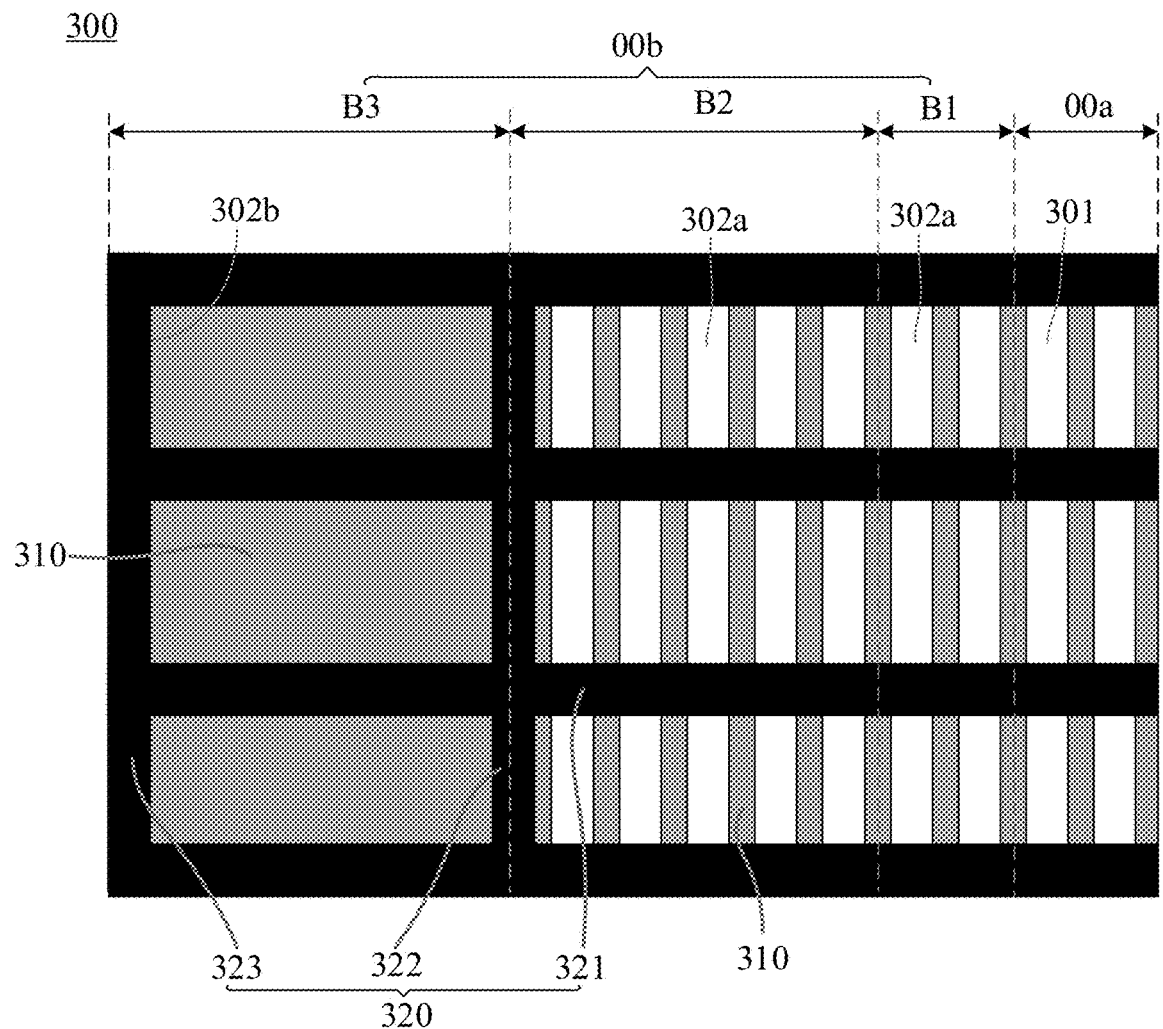
FIG. 11 is a locally enlarged view of a pixel defining layer in a display panel according to some embodiments of the present disclosure.
Figure 12:
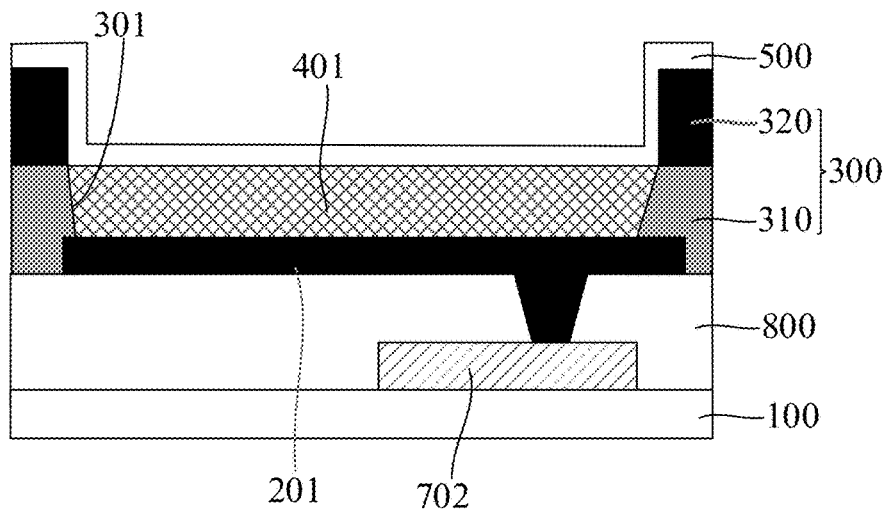
FIG. 12 is a schematic diagram of a film layer structure of the display panel at F-F' shown in FIG. 5.

For example, as shown in FIG. 11 and FIG. 12, FIG. 11 is a locally enlarged view of a pixel defining layer in a display panel according to some embodiments of the present disclosure, and FIG. 12 is a schematic diagram of a film layer structure of the display panel at F-F' shown in FIG. 5. The pixel defining layer 300 in the display panel 000 may include a first defining sublayer 310 and a second defining sublayer 320 located on a side of the first defining sublayer 310 distal from the substrate 100.

The first defining sublayer 310 is provided with the plurality of effective pixel openings 301 and the plurality of dummy pixel openings 302a. That is, the first defining sublayer 310 is a grid-shaped film layer with a plurality of openings. The openings may be distributed in the display region 00a, the first peripheral subregion B1, and the second peripheral subregion B2. In addition, a part of the first defining sublayer 310 located in the third peripheral subregion B3 is a film layer structure disposed as a whole layer. That is, the part of the first defining sublayer 310 located in the third peripheral subregion B3 is not provided with an opening. The auxiliary opening 302b in the pixel defining layer 300 may be distributed in the second defining sublayer 320. In other words, the second defining sublayer 320 is provided with the auxiliary opening 302b. In this case, a bottom of the organic solution printed into the auxiliary opening 302b can be in contact with the first defining sublayer 310, such that the flow of the organic solution in the auxiliary opening 302b is not affected.

Optionally, as shown in FIG. 11, the second defining sublayer 320 may include a plurality of retaining walls 321 arranged in parallel. The retaining walls 321 may be distributed in at least the display region 00a, the first peripheral subregion B1, and the second peripheral subregion B2 of the display panel 000. Each effective light-emitting portion 401 and each auxiliary dummy portion 402 distributed between two adjacent retaining walls 321 are of a same type. That is, each effective light-emitting portion 401 between two adjacent retaining walls 321 is configured to emit light of a same color, and the effective light-emitting portion 401 and the auxiliary dummy portion 402 between two adjacent retaining walls 321 are made of a same material.

For example, the plurality of effective pixel openings 301 in the display region 00a may be arrayed in a plurality of rows and columns. The effective light-emitting portions 401 in a row of effective pixel openings 301 are of a same type. For two adjacent rows of effective pixel openings 301, a type of the effective light-emitting portions 401 in one row of effective pixel openings 301 is different from a type of the effective light-emitting portions 401 in another row of effective pixel openings 301. That is, the effective light-emitting portions 401 in a row of effective pixel openings 301 are configured to emit light of a same color. For two adjacent rows of effective pixel openings 301, a color of light emitted by the effective light-emitting portions 401 in one row of effective pixel openings 301 is different from a color of light emitted by the effective light-emitting portions 401 in another row of effective pixel openings 301. For example, the plurality of effective pixel openings 301 in the display region 00a may be arrayed with a period of three rows of effective pixel openings. The effective light-emitting portions in the three rows of effective pixel openings may be configured to emit red light, green light, and blue light respectively.

In this case, the retaining wall 321 may be distributed between two adjacent rows of effective pixel openings 301. When the light-emitting layer 400 is formed through the ink-jet printing process, the effective pixel openings 301 are distributed in the first defining sublayer 310, and the second defining sublayer 320 is located on the side of the first defining sublayer 310 distal from the substrate 100. Therefore, the organic solution printed into a row of effective pixel openings 301 can be blocked by the retaining wall 321 in the second defining sublayer 320, such that the organic solution in the row of effective pixel openings 301 does not flow into an adjacent row of effective pixel openings 301. In addition, a thickness of the first defining sublayer 310 is small, and the organic solution printed into an effective pixel opening may flow into an adjacent effective pixel opening in a row direction. However, because the effective light-emitting portions 401 distributed in the effective pixel openings 301 in a row of effective pixel openings 301 are of the same type, it can be ensured that the display effect of the display panel 000 is not affected even if the organic solution flows into two adjacent effective pixel openings in a row of effective pixel openings 301.

It should be noted that in another possible implementation, the effective light-emitting portions 401 in a column of effective pixel openings 301 may alternatively be of a same type. For two adjacent columns of effective pixel openings 301, a type of the effective light-emitting portions 401 in one column may be different from a type of the effective light-emitting portions 401 in another column. In this case, the retaining wall 321 may be distributed between two columns of effective pixel openings 301, which is not limited in the embodiments of the present disclosure.

In the embodiments of the present disclosure, the retaining walls 321 in the second defining sublayer 320 may be further distributed in the third peripheral subregion B3 or may be distributed outside the third peripheral subregion B3. In view of this, the embodiments of the present disclosure will be described by using the following two optional implementations as examples:

In a first optional implementation, when the retaining walls 321 in the second defining sublayer 320 are further distributed in the third peripheral subregion B3, as shown in FIG. 11, parts of two adjacent retaining walls 321 located in the third peripheral subregion B3 are used to define one auxiliary opening 302b. In this case, the printhead can continuously print the organic solution into the auxiliary opening 302b, such that ink-jet by the printhead can quickly stabilize.

Figure 13:
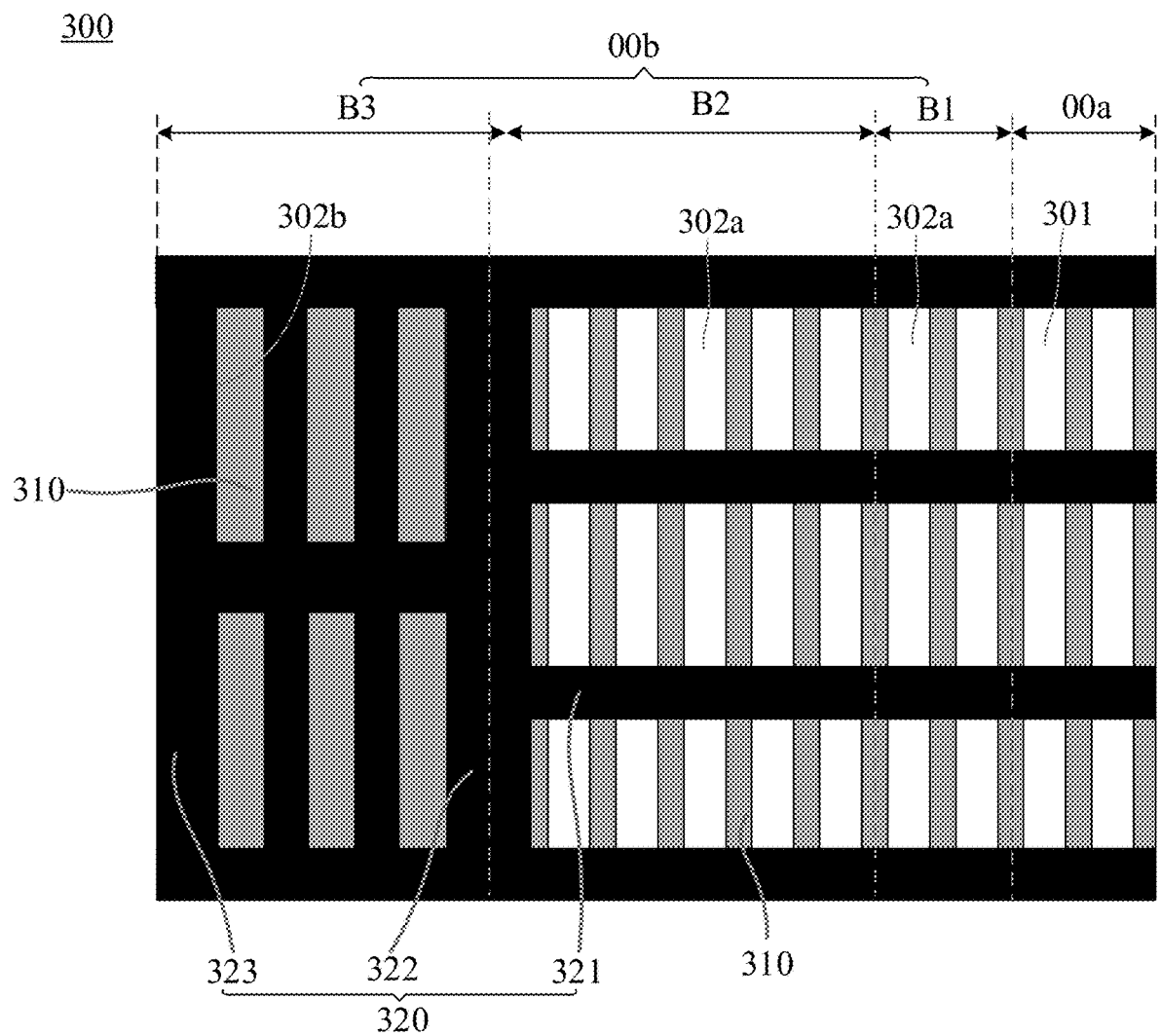
FIG. 13 is a top view of a pixel defining layer in another display panel according to some embodiments of the present disclosure.

In a second optional implementation, as shown in FIG. 13, FIG. 13 is a top view of a pixel defining layer in another display panel according to some embodiments of the present disclosure. When the retaining walls 321 in the second defining sublayer 320 are distributed outside the third peripheral subregion B3, a part of the second defining sublayer 320 located in the third peripheral subregion B3 is provided with a plurality of auxiliary openings 302b arranged in an array. A distribution density of the plurality of auxiliary openings 302b is less than or equal to the distribution density of the plurality of dummy pixel openings 302a. In this case, when the printhead prints the organic solution into the plurality of auxiliary openings 302b, ink-jet by the printhead can gradually stabilize and the flow of the organic solution in the plurality of auxiliary openings 302b can be simulated through the flow of the organic solution in the auxiliary openings 302b, such that the subsequent flow of the organic solution in the plurality of dummy pixel openings 302a can quickly stabilize.

Optionally, as shown in FIG. 11 and FIG. 13, the second defining sublayer 320 may further include a first auxiliary retaining wall 322. The first auxiliary retaining wall 322 may be located between the third peripheral subregion B3 and the second peripheral subregion B2 An extension direction of the first auxiliary retaining wall 322 may intersect an extension direction of the retaining wall 321. For example, the extension direction of the first auxiliary retaining wall 322 may be perpendicular to the extension direction of the retaining wall 321. In a possible case, the extension direction of the retaining wall 321 may be parallel to a row arrangement direction of the plurality of effective pixel openings 301, and the extension direction of the first auxiliary retaining wall 322 may be parallel to a column arrangement direction of the plurality of effective pixel openings 301. In this case, a printing environment of the third peripheral subregion B3 greatly differs from that of the second peripheral subregion B2. Therefore, to ensure that the organic solution in the auxiliary opening 302b in the third peripheral subregion B3 does not affect the organic solution in the dummy pixel openings 302a in the second peripheral subregion B2, the first auxiliary retaining wall 322 may be disposed between the second peripheral subregion B2 and the third peripheral subregion B3, such that the first auxiliary retaining wall 322 can isolate the organic solution in the two regions.

In the present disclosure, as shown in FIG. 11 and FIG. 13, the second defining sublayer 320 may further include a second auxiliary retaining wall 323. The second auxiliary retaining wall 323 may be located on a side of the third peripheral subregion B3 distal from the display region 00a. An extension direction of the second auxiliary retaining wall 323 may be parallel to the extension direction of the first auxiliary retaining wall 322. In this case, the second auxiliary retaining wall 323 can prevent the organic solution printed into the auxiliary opening 302b from being leaked from the side of the third peripheral subregion B3 distal from the display region 00a.

It should be noted that the foregoing embodiments are mainly schematically described by using an example in which the auxiliary openings 302b are located on left and right sides of the display panel 000. For distribution of the auxiliary openings 302b on upper and lower sides of the display panel 000, the retaining walls 321 may be distributed only in the third peripheral subregion B3, such that two adjacent retaining walls 321 can define the auxiliary opening 302b in the third peripheral subregion B3.

In the embodiments of the present disclosure, as shown in FIG. 5 and FIG. 10, in the non-display region 00b of the display panel 000, the first peripheral subregion B1 needs to be distributed around the display region 00a, and the third peripheral subregion B3 also needs to be distributed around the display region. For a reason why the first peripheral subregion B1 is distributed around the display region 00a, reference may be made to the corresponding content of the foregoing embodiments, details of which are not described herein again.

For the third peripheral subregion B3, the auxiliary opening 302b distributed in the third peripheral subregion B3 mainly serves to stabilize ink-jet by the printhead. The printhead takes a long time from initial ink-jet to stable ink-jet, and the printhead usually performs printing from one side to the other side. Therefore, when the third peripheral subregion B3 is distributed around the display region 00a, the printhead can continuously perform ink-jet in the third peripheral subregion B3 with a large length, to ensure that ink-jet by the printhead can tend to be stable. For example, it is assumed that the printhead performs printing from the left side to the right side of the display panel 000, when the third peripheral subregion B3 is distributed around the display region 00a, the printhead can continuously perform ink-jet in a part of the third peripheral subregion B3 located on the upper or lower side of the display region 00a.

In the present disclosure, in the non-display region 00b of the display panel 000, the second peripheral subregion B2 may be distributed toward two opposite first sides of the display region 00a. The first side of the display region 00a may be a side of the display region 00a adjacent to the GOA circuit 602. That is, there are two second peripheral subregions B2. The two second peripheral subregions B2 are strip-shaped. One of the second peripheral subregions B2 may be distributed toward one first side of the display region 00a, and the other second peripheral subregion B2 may be distributed toward the other first side of the display region 00a.

The printhead may perform printing from one first side to the other first side of the display region 00a. Therefore, when the second peripheral subregion B2 is distributed toward the two opposite first sides of the display region 00a, the printhead can first print the organic material into the dummy pixel openings 302a distributed in the second peripheral subregion B2, and then print the organic material into the effective pixel openings 301 distributed in the display region 00a during organic material printing, to ensure that the printhead uniformly prints the organic material into the effective pixel openings 301.

It should be noted that an example in which the second peripheral subregion B2 is distributed toward the two opposite first sides of the display region 00a is used for schematic description in the embodiments of the present disclosure. In another possible implementation, the second peripheral subregion B2 may further be distributed toward two opposite second sides of the display region 00a. The second side of the display region 00a is a side of the display region 00a adjacent to the first side. In this case, the second peripheral subregion B2 is annular, and the second peripheral subregion B2 may also be distributed around the display region 00a.

Optionally, as shown in FIG. 4, the display panel 000 may further include a plurality of gate lines G and a plurality of data lines D. The plurality of gate lines G may be arranged in parallel.

The plurality of data lines D may also be arranged in parallel. An extension direction of the gate line G may be perpendicular to an extension direction of the data line D. Large parts of the gate line G and the data line D are located in the display region 00a of the display panel 000, and small parts of the gate line G and the data line D are located in the non-display region 00b and electrically connected to drive structures disposed in the non-display region 00b.

For example, the peripheral conductive structure 600 in the display panel 000 may further include the GOA circuit 602 and the MUX circuit 603 that are located in the non-display region 00b. The GOA circuit 602 may be distributed toward the first side of the display region 00a. The MUX circuit 603 may be distributed toward the second side of the display region 00a. The part of the gate line G located in the non-display region 00b may be electrically connected to the GOA circuit 602. A gate drive signal may be applied to the gate line G through the GOA circuit 602.

The part of the data line D located in the non-display region 00b may be electrically connected to the MUX circuit 603. In the present disclosure, the display panel 000 may further include a plurality of first pad groups S1 located on a side of the MUX circuit 603 distal from the display region 00a. The MUX circuit 603 may be electrically connected to the plurality of first pad groups S1. Each of the first pad groups S1 is configured to bond a chip on film (COF). In this way, the COF can apply a data signal to the data line D through the first pad group S1 and the MUX circuit. The plurality of first pad groups S1 are electrically connected to the plurality of data lines D through the MUX circuit 603. The MUX circuit 603 can effectively reduce a quantity of pads in the plurality of first pad groups S1. That is, when the plurality of first pad groups S1 are electrically connected to the plurality of data lines D through the MUX circuit 603, it can be ensured that a total quantity of pads in the plurality of first pad groups S1 is less than a quantity of the data lines D in the display panel 000, to ensure low difficulty in bonding the COF to the display panel 000.

It should be noted that the GOA circuit 602 may be located in a part of the third peripheral subregion B3 adjacent to the two opposite first sides of the display region 00a. In this case, the orthographic projection of the GOA circuit 602 on the substrate 100 may overlap the orthographic projection of the auxiliary opening 302b in the pixel defining layer 300 on the substrate 100. It is assumed that the two opposite first sides of the display region 00a are the left and right sides, disposing the GOA circuit 602 in the third peripheral subregion B3 can achieve left and right narrow frames of the display panel 000.

The MUX circuit 603 may be located in a part of the third peripheral subregion B3 adjacent to one second side of the display region 00a. In this case, the orthographic projection of the MUX circuit 603 on the substrate 100 may overlap the orthographic projection of the auxiliary opening 302b in the pixel defining layer 300 on the substrate 100. It is assumed that one second side of the display region 00a adjacent to the MUX circuit 603 is the lower side, disposing the MUX circuit 603 in the third peripheral subregion B3 can achieve a lower narrow frame of the display panel 000.

In the present disclosure, the plurality of pixel driving circuits 702 in the display panel 000 may be arrayed in a plurality of rows and columns. A part of one gate line G located in the display region 00a may be electrically connected to each pixel driving circuit 702 in a row of pixel driving circuits 702. A part of one data line D located in the display region 00a may be electrically connected to a column of pixel driving circuits 702. One pixel driving circuit 702 may be distributed in a region surrounded by two adjacent gate lines G and two adjacent data lines D.

In the embodiments of the present disclosure, the dummy pixel circuits 701 and the pixel driving circuits 702 in the display panel 000 are simultaneously formed. The gate line electrically connected to a row of pixel driving circuits 702 and the data line electrically connected to a column of pixel driving circuits 702 are synchronously formed when the plurality of pixel driving circuits 702 are formed. Therefore, a redundant signal line connected to a row of dummy pixel circuits 701 is also formed when the plurality of dummy pixel circuits 701 are formed. The redundant signal line may be distributed in at least the first peripheral subregion B1.

For example, the redundant signal line in the display panel 000 may include a first redundant signal line electrically connected to a row of dummy pixel circuits 702 and a second redundant signal line electrically connected to a column of dummy pixel circuits 702. An extension direction of the first redundant signal line is parallel to the extension direction of the gate line G. An extension direction of the second redundant signal line is parallel to the extension direction of the data line D.

In the embodiments of the present disclosure, the dummy pixel circuit 702 does not apply an electrical signal to the dummy electrode 202. Therefore, it needs to be ensured that no drive signal is applied to the first redundant signal line and the second redundant signal line. For example, the first redundant signal line may be disconnected from the GOA circuit 602, and the second redundant signal line may be disconnected from the MUX circuit 603. In this way, the first redundant signal line and the second redundant signal line are in a floating state. When the first redundant signal line and the second redundant signal line are in the floating state, the first redundant signal line may interfere with a data signal applied to the data line D crossing the first redundant signal line, and the second redundant signal line may also interfere with a gate drive signal applied to the gate line G crossing the second redundant signal line. Therefore, the redundant signal line in the display panel 000 needs to be further processed in the embodiments of the present disclosure. In the present disclosure, the redundant signal line may be processed in the following two cases to ensure that the redundant signal line does not interfere with a signal applied to another signal line.

In a first case, the redundant signal line may be electrically connected to the power signal line 601 in the peripheral conductive structure 600. A signal applied to the power signal line 601 is an electrical signal with a fixed potential. Therefore, when the redundant signal line is electrically connected to the power signal line 601, the electrical signal with the fixed potential can also be applied to the redundant signal line. This can ensure that the redundant signal line is no longer in the floating state, such that the redundant signal line does not interfere with another signal line. In addition, when the electrical signal with the fixed potential is applied to the redundant signal line, the dummy pixel circuit 701 electrically connected to the redundant signal line cannot operate normally, to ensure that the dummy pixel circuit 701 does not apply a drive signal to the dummy electrode 202.

Figure 14:
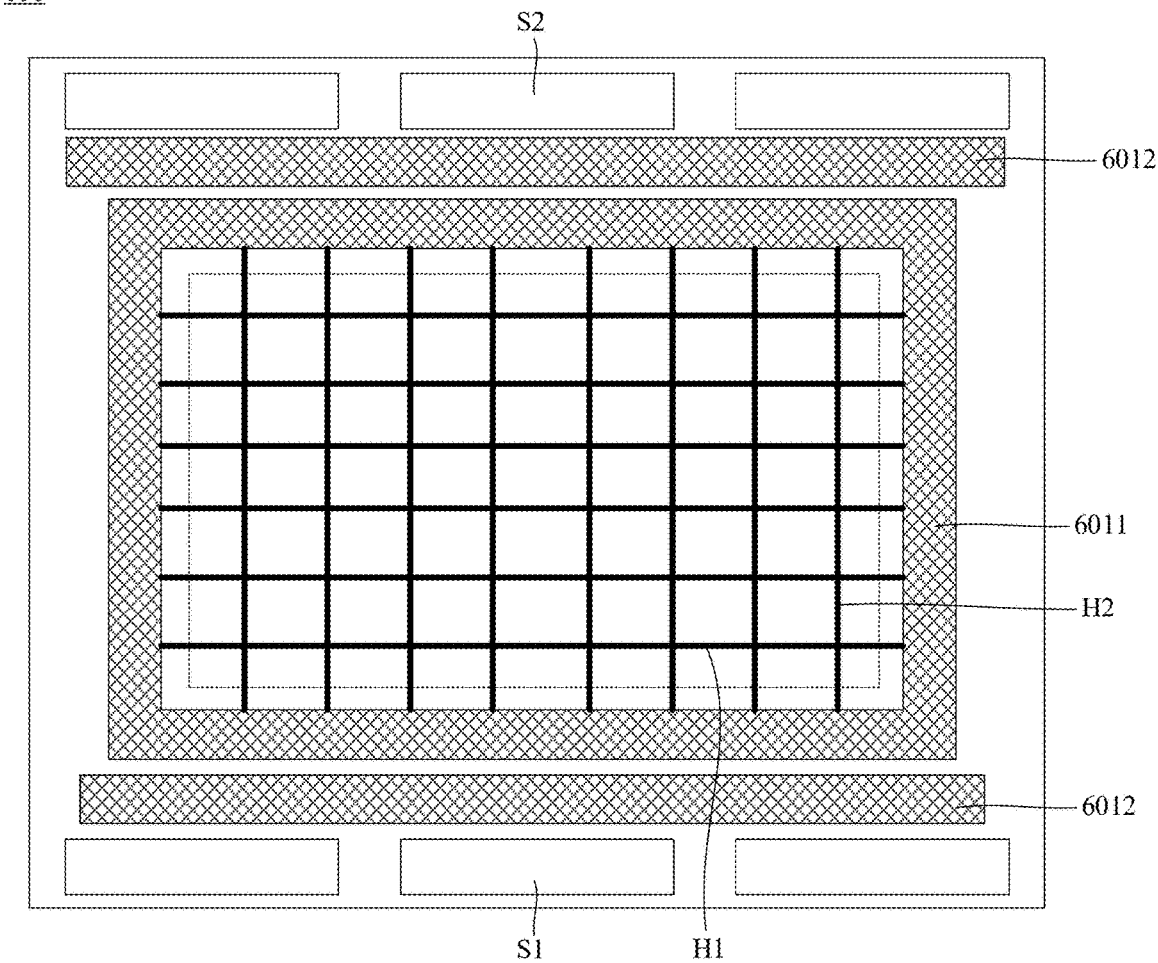
FIG. 14 is a top view of another display panel according to some embodiments of the present disclosure.

For example, as shown in FIG. 14, FIG. 14 is a top view of another display panel according to some embodiments of the present disclosure. The power signal line 601 in the peripheral conductive structure 600 may include a first power signal line 6011 and a second power signal line 6012. One of the first power signal line 6011 and the second power signal line 6012 may be a high-level power signal line (namely, a VDD power signal line), and the other of the first power signal line 6011 and the second power signal line 6012 may be a low-level power signal line (namely, a VSS power signal line). It should be noted that the embodiments of the present disclosure are schematically described by using an example in which the first power signal line 6011 is the VDD power signal line and the second power signal line 6012 is the VSS power signal line.

As shown in FIG. 14, the first power signal line 6011 in the peripheral conductive structure 600 may be an annular power signal line. The first power signal line 6011 is distributed around the display region 00a. That is, the first power signal line 6011 may include two opposite first segments and two opposite second segments. The first segments of the first power signal line 6011 may be distributed toward the first sides of the display region 00a. The first segments of the first power signal line 6011 may be located in the second peripheral subregion B2. The second segments of the first power signal line 6011 may be distributed toward the second sides of the display region 00a. The second segments of the first power signal line 6011 may be located in the third peripheral subregion B3. In the present disclosure, the first power signal line 6011 may be electrically connected to the plurality of pixel driving circuits 702 disposed in the display region 00a. For example, the display panel 000 may further include a plurality of first power connection lines H1 arranged in parallel and a plurality of second power connection lines H2 arranged in parallel in the display region 00a. The first power connection line H1 may be arranged in parallel to the gate line G. Both ends of the first power connection line H1 may be electrically connected to the two opposite first segments of the first power signal line 6011 respectively. The second power connection line H2 may be arranged in parallel to the data line D. Both ends of the second power connection line H2 may be electrically connected to the two opposite second segments of the first power signal line 6011 respectively. At least one of the first power connection line H1 and the second power connection line H2 may be electrically connected to the pixel driving circuit 702 in the display region 00a such that the pixel driving circuit 702 can be electrically connected to the first power signal line 6011.

There may be two second power signal lines 6012 in the peripheral conductive structure 600. The two second power signal lines 6012 may be distributed toward the two second sides of the display region 00a. The two second power signal lines 6012 may be located in the third peripheral subregion B3. The two second power signal lines 6012 may be electrically connected to the second electrode layer 500. It should be noted that the plurality of first pad groups S1 are disposed on the lower side of the display panel 000, and a plurality of second pad groups S2 are also disposed on the upper side of the display panel 000. The COF may be bound to the lower side of the display panel 000 through the plurality of first pad groups S1. The COF may apply a VSS signal to the second power signal line 6012 on the lower side of the display panel 000. A flexible printed circuit (FPC) may be bonded to the upper side of the display panel 000 through the plurality of second pad groups S2. The FPC may apply a VSS signal to the second power signal line 6012 on the upper side of the display panel 000.

In this case, both ends of the first redundant signal line parallel to the gate line G are electrically connected to the first power signal line 6011. For example, both ends of the first redundant signal line are electrically connected to the two opposite first segments of the first power signal line 6011 respectively. In this way, the first power signal line 6011 can apply a VDD signal with a fixed potential to the first redundant signal line.

In a possible case, both ends of the second redundant signal line parallel to the data line D are electrically connected to the first power signal line 6011. For example, both ends of the second redundant signal line are electrically connected to the two opposite second segments of the first power signal line 6011 respectively. In this way, the first power signal line 6011 can apply a VDD signal with a fixed potential to the second redundant signal line.

In another possible case, both ends of the second redundant signal line parallel to the data line D are electrically connected to the two second power signal lines 6012 respectively. In this way, the second power signal line 6012 can apply a VSS signal with a fixed potential to the second redundant signal line.

Figure 15:
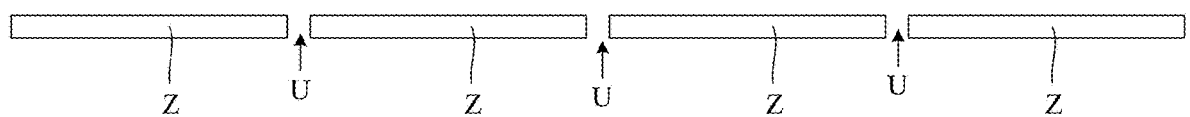
FIG. 15 is a top view of a redundant signal line according to some embodiments of the present disclosure.

In a second case, as shown in FIG. 15, FIG. 15 is a top view of a redundant signal line according to some embodiments of the present disclosure. The redundant signal line in the display panel 000 may be provided as a plurality of redundant electrode blocks Z that are independently distributed and insulated from each other. That is, isolation processing may be performed on a plurality of positions of the redundant signal line, such that isolation intervals U are distributed between the redundant electrode blocks Z. In this case, an overlapping area between the redundant electrode block Z and another signal line can be effectively reduced, such that a parasitic capacitance between the redundant electrode block Z and the another signal line is small, and a probability that the redundant signal line interferes with the another signal line can be effectively reduced. It should be noted that isolation processing is performed on both the first redundant signal line and the second redundant signal line to reduce a probability of interference with other signal lines.

Figure 16:
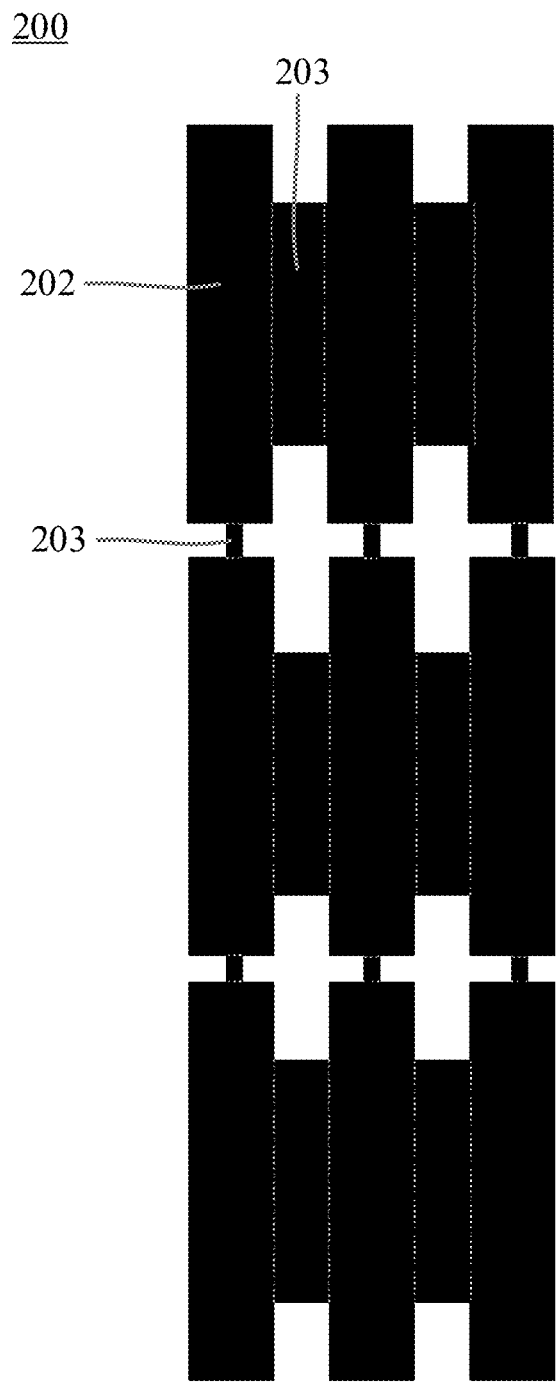
FIG. 16 is a top view of a part of a first electrode layer located in a first peripheral subregion or a second peripheral subregion according to some embodiments of the present disclosure.

Optionally, as shown in FIG. 16, FIG. 16 is a top view of a part of a first electrode layer located in a first peripheral subregion or a second peripheral subregion according to some embodiments of the present disclosure. The first electrode layer 200 may further include a connection electrode 203 configured to connect two adjacent dummy electrodes 202. The dummy electrodes 202 in the first electrode layer 200 may be integrally connected through the connection electrode 203. For example, the plurality of dummy electrodes 202 in the first electrode layer 200 are uniformly distributed in the first peripheral subregion B1 and the second peripheral subregion B2, and the first peripheral subregion B1 is an annular region distributed around the display region 00*a*. Therefore, the dummy electrodes 202 may be connected through the connection electrode 203 as an annular electrode distributed around the display region 00*a*. In the present disclosure, the dummy electrode 202 in the first electrode layer 200 may be electrically connected to the power signal line 601. For example, the dummy electrode 202 may be electrically connected to the second power signal line 6022. In this way, after the dummy electrodes 202 are connected through the connection electrode 203 as the annular electrode distributed around the display region 00*a*, the annular electrode may be electrically connected to the second power signal line 6022, such that the second power signal line 6022 can apply a VSS signal with a fixed potential to the annular electrode. Therefore, the VSS signal with the fixed potential can be applied to each dummy electrode 202, such that the dummy electrode 202 is no longer in the floating state, and the dummy electrode 202 does not interfere with other signal lines.

It should be noted that when the VSS signal is applied to the dummy electrode 202, the dummy electrode 202 may apply the VSS signal to one side of the auxiliary dummy portion 402 in the corresponding dummy pixel opening 302*a*. The other side of the auxiliary dummy portion 402 is in contact with the second electrode layer 500, such that the VSS signal is applied to the other side of the auxiliary dummy portion 402 through the second electrode layer 500.

Therefore, the VSS signals with the same potential are applied to both sides of the auxiliary dummy portion 402, and the auxiliary dummy portion 402 does not emit light outward.

Figure 17:
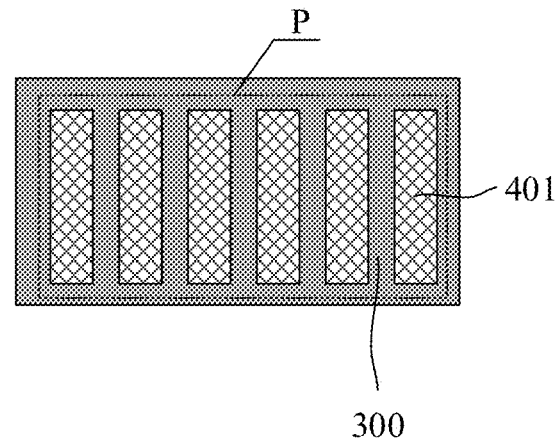
FIG. 17 is a locally enlarged view of a display region of a display panel according to some embodiments of the present disclosure.

Optionally, as shown in FIG. 17, FIG. 17 is a locally enlarged view of a display region of a display panel according to some embodiments of the present disclosure. The display region 00*a* of the display panel 000 may include a plurality of pixel subregions P. The plurality of pixel subregions P may be arrayed in a plurality of rows and columns. Each pixel subregion P may include at least two effective pixel openings 301 arranged side by side. The effective light-emitting portions 401 in the at least two effective pixel openings 301 in each pixel subregion P are of a same type. It should be noted that the at least two effective pixel openings 301 in each pixel subregion P may be arrayed in one row and at least two columns.

In the embodiments of the present disclosure, the effective light-emitting portion 401 in each effective pixel opening 301, the corresponding first electrode 201 in the first electrode layer 200, and a corresponding part of the second electrode layer 500 can constitute one light-emitting device. Therefore, arranging at least two effective pixel openings 301 in each pixel subregion P can ensure that at least two light-emitting devices are distributed in a single pixel subregion P. For example, 11 effective pixel openings 301 may be provided in a single pixel subregion P, such that 11 light-emitting devices can be distributed in a single pixel subregion P. In this way, it can ensure that the display panel 000 has a high resolution. Some optical lenses with microlenses are subsequently disposed on a light exit side of the display panel 000, such that the display panel 000 can have a naked-eye three-dimensional (3D) display effect.

It should be noted that the pixel driving circuit 702 in the display panel 000 may be electrically connected to the light-emitting device through the first electrode 201. The pixel driving circuit 702 may be a 3T1C drive circuit, a 5T1C drive circuit, or a 7T1C drive circuit. The 5T1C drive circuit means that the pixel driving circuit 702 includes five transistors and one storage capacitor. The following embodiments are schematically described by using an example in which the pixel driving circuit 702 is the 5T1C drive circuit.

Figure 18:
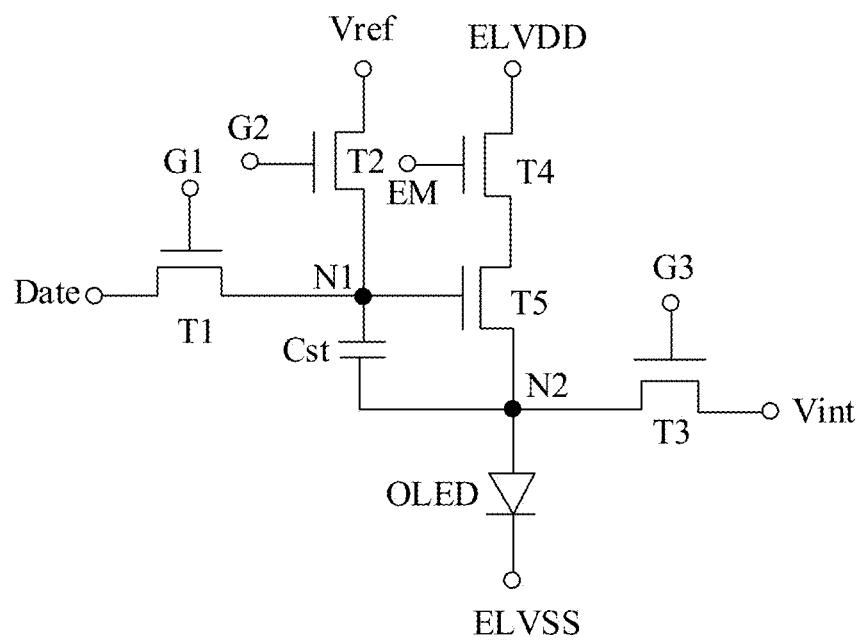
FIG. 18 is a circuit diagram of a pixel driving circuit according to some embodiments of some present disclosure.

As shown in FIG. 18, FIG. 18 is a circuit diagram of a pixel driving circuit according to some embodiments of the present disclosure. The pixel driving circuit 702 may include five transistors and one storage capacitor Cst. The five transistors are a first transistor T1, a second transistor T2, a third transistor T3, a fourth transistor T4, and a fifth transistor T5.

A first electrode of the first transistor T1 may be connected to a data signal terminal Date. A second electrode of the first transistor T1 may be connected to a first node N1. A gate of the first transistor T1 may be connected to a first control signal line G1.

A first electrode of the second transistor T2 may be connected to a reference power terminal Vref. A second electrode of the second transistor T2 may be connected to the first node N1. A gate of the second transistor T2 may be connected to a second control signal line G2.

A first electrode of the third transistor T3 may be connected to a control initial power terminal Vinit. A second electrode of the third transistor T3 may be connected to a second node N2. A gate of the third transistor T3 may be connected to a third control signal line G3.

A first electrode of the fourth transistor T4 may be connected to a high-level voltage ELVDD. A second electrode of the fourth transistor T4 may be connected to a first electrode of the fifth transistor T5. A gate of the fourth transistor T4 may be connected to a light-emitting control signal terminal EM.

A second electrode of the fifth transistor T5 is connected to the second node N2. A gate of the fifth transistor T5 is connected to the first node N1.

A first terminal of the storage capacitor Cst is connected to the first node N1. A second terminal of the storage capacitor Cst is connected to the second node N2.

An anode in the OLED light-emitting device is connected to the second node N2. A cathode in the OLED light-emitting device is connected to a low-level voltage ELVSS.

In summary, the display panel provided in the embodiments of the present disclosure includes the substrate, the first electrode layer, the pixel defining layer, the light-emitting layer, the second electrode layer, and the peripheral conductive structure. When the light-emitting layer is formed through the ink-jet printing process, the organic solution can be printed into the auxiliary dummy openings in the initial printing phase, and then printed into the effective pixel openings after printing becomes stable. In this way, it can ensure that the organic solution printed into the effective pixel openings is uniform, such that the effective light-emitting portions formed after the organic solution in the effective pixel openings is solidified have good uniformity and the display panel has a good display effect. Although the organic solution printed into the auxiliary dummy openings is not uniform and the auxiliary dummy portions formed after the organic solution is solidified have poor uniformity, the auxiliary dummy portions do not emit light outward and do not affect the display effect of the display panel. In addition, the orthographic projection of the peripheral conductive structure in the display panel on the substrate overlaps the orthographic projection of the auxiliary dummy opening on the substrate. Therefore, there is no need for the additional region in which only the auxiliary dummy openings are arranged in the non-display region, such that the width of the non-display region of the display panel is small and the narrow frame of the display panel can be achieved.

The embodiments of the present disclosure further provide a display apparatus. The display apparatus may be any product or component with a display function, such as a mobile phone, a tablet computer, a television, a display, a notebook computer, a digital photo frame, or a navigator. The display apparatus may include a power supply assembly and a display panel. The display panel may be the display panel in the foregoing embodiments.

Optionally, the display apparatus may further include an optical lens located on a light exit side of the display panel 000. The optical lens has a plurality of microlenses. The plurality of microlenses in the optical lens may correspond to the plurality of pixel subregions in the display panel 000. For example, each microlens may correspond to at least two pixel subregions. In this way, the display panel 000 can have the naked-eye 3D display effect.

It should be noted that in the accompanying drawings, sizes of layers and regions may be exaggerated for clarity of illustration. In addition, it can be understood that when an element or layer is referred to as being "on" another element or layer, the element or layer may be directly on the another element or there may be an intervening layer. It can be understood that when an element or layer is referred to as being "under" another element or layer, the element or layer may be directly under the another element or there may be at least one intervening layer or element. It can be understood that when a layer or element is referred to as being "between" two layers or elements, the layer or element may be the only layer between the two layers or elements, or there may be at least one intervening layer or element. Similar reference numerals indicate similar elements.

In the present disclosure, terms such as "first" and "second" are merely intended for the purpose of description, and should not be construed as indicating or implying relative importance. The term "a plurality of" means two or more, unless otherwise specifically defined.

The foregoing descriptions are merely optional embodiments of the present disclosure and are not intended to limit the present disclosure. Any modification, equivalent replacement, and improvement within the spirit and principle of the present disclosure shall be included within the protection scope of the present disclosure.

What is claimed is:

1. A display panel, having a display region and a non-display region at a periphery of the display region, and comprising:
   a substrate;
   a first electrode layer on a side of the substrate, wherein the first electrode layer comprises a plurality of first electrodes that are independently distributed;
   a pixel defining layer on a side of the first electrode layer distal from the substrate, wherein the pixel defining layer is provided with a plurality of effective pixel openings in the display region and a plurality of auxiliary dummy openings in the non-display region, wherein the plurality of effective pixel openings are in a one-to-one correspondence with the plurality of first electrodes, and an orthographic projection of the effective pixel opening on the substrate falls into an orthographic projection of a corresponding first electrode on the substrate;
   a light-emitting layer, wherein the light-emitting layer comprises effective light-emitting portions in the effective pixel openings and auxiliary dummy portions in the auxiliary dummy openings;
   a second electrode layer on a side of the light-emitting layer distal from the substrate; and
   a peripheral conductive structure in the non-display region, wherein an orthographic projection of the peripheral conductive structure on the substrate overlaps an orthographic projection of the auxiliary dummy opening on the substrate.

2. The display panel according to claim 1, wherein the plurality of auxiliary dummy openings comprise a plurality of dummy pixel openings, wherein the dummy pixel opening has a same shape and size as the effective pixel opening.

3. The display panel according to claim 2, wherein a distribution density of the plurality of dummy pixel openings is a same as a distribution density of the plurality of effective pixel openings.

4. The display panel according to claim 2, wherein the first electrode layer further comprises a plurality of dummy electrodes, wherein the plurality of dummy electrodes are in a one-to-one correspondence with the plurality of dummy pixel openings, and an orthographic projection of the dummy pixel opening on the substrate falls into an orthographic projection of a corresponding dummy electrode on the substrate.

5. The display panel according to claim 4, wherein the peripheral conductive structure comprises a power signal line, wherein an orthographic projection of at least one of the plurality of dummy electrodes on the substrate overlaps an orthographic projection of the power signal line on the substrate.

6. The display panel according to claim 5, wherein the non-display region comprises a first peripheral subregion and a second peripheral subregion, wherein the first peripheral subregion is closer to the display region than the second peripheral subregion, at least a part of the power signal line is in the second peripheral subregion, and the power signal line is outside the first peripheral subregion;
the plurality of dummy electrodes comprise a plurality of first dummy sub-electrodes in the first peripheral subregion and a plurality of second dummy sub-electrodes in the second peripheral subregion; and
the display panel further comprises a plurality of dummy pixel circuits that are in a one-to-one correspondence with the plurality of first dummy sub-electrodes, wherein the plurality of dummy pixel circuits are in the first peripheral subregion, and the dummy pixel circuit is insulated from a corresponding first dummy sub-electrode.

7. The display panel according to claim 6, further comprising a plurality of pixel driving circuits in the display region, and a planarization layer on a side of the plurality of pixel driving circuits and the plurality of dummy pixel circuits distal from the substrate; wherein
the plurality of pixel driving circuits and the plurality of dummy pixel circuits are in a same layer, and the plurality of pixel driving circuits are in a one-to-one correspondence with the plurality of first electrodes; and
the dummy pixel circuit is insulated from the corresponding first dummy sub-electrode through the planarization layer, the planarization layer is provided with a plurality of connection vias distributed in the display region, and the pixel driving circuit is electrically connected to a corresponding first electrode through the connection via.

8. The display panel according to claim 6, further comprising a redundant signal line connected to a row of the dummy pixel circuits, wherein the redundant signal line is distributed in at least the first peripheral subregion; and
the redundant signal line is electrically connected to the power signal line, or the redundant signal line comprises a plurality of redundant electrode blocks that are independently distributed and insulated from each other.

9. The display panel according to claim 6, wherein the non-display region further comprises a third peripheral subregion, wherein the second peripheral subregion is closer to the display region than the third peripheral subregion; and
the plurality of auxiliary dummy openings further comprise an auxiliary opening in the third peripheral subregion; and the peripheral conductive structure further comprises a gate driver on array (GOA) circuit and a multiplexer (MUX) circuit that are in the third peripheral subregion, and the plurality of dummy electrodes are all outside the third peripheral subregion.

10. The display panel according to claim 9, wherein the pixel defining layer comprises a first defining sublayer and a second defining sublayer on a side of the first defining sublayer distal from the substrate; and
the first defining sublayer is provided with the plurality of effective pixel openings and the plurality of dummy pixel openings, a part of the first defining sublayer in the third peripheral subregion is a film layer structure disposed as a whole layer, and the second defining sublayer is provided with the auxiliary opening.

11. The display panel according to claim 10, wherein the second defining sublayer comprises a plurality of retaining walls arranged in parallel, wherein the retaining walls are distributed in at least the display region, the first peripheral subregion, and the second peripheral subregion, and each effective light-emitting portion and each auxiliary dummy portion distributed between two adjacent ones of the retaining walls are of a same type.

12. The display panel according to claim 11, wherein the retaining walls are further distributed in the third peripheral subregion, and parts of two adjacent ones of the retaining walls in the third peripheral subregion are used to define one auxiliary opening.

13. The display panel according to claim 11, wherein the retaining walls are distributed outside the third peripheral subregion, a part of the second defining sublayer in the third peripheral subregion is provided with a plurality of auxiliary openings arranged in an array, and an arrangement density of the plurality of auxiliary openings is less than or equal to an arrangement density of the plurality of dummy pixel openings.

14. The display panel according to claim 10, wherein the second defining sublayer further comprises a first auxiliary retaining wall, wherein the first auxiliary retaining wall is between the third peripheral subregion and the second peripheral subregion, and an extension direction of the first auxiliary retaining wall intersects an extension direction of the retaining wall.

15. The display panel according to claim 10, wherein the first peripheral subregion and the third peripheral subregion are distributed around the display region; and
the second peripheral subregion is distributed around the display region, or the second peripheral subregion is distributed toward two opposite first sides of the display region, the first side of the display region being a side of the display region adjacent to the GOA circuit.

16. The display panel according to claim 15, wherein the redundant signal line in the display panel comprises a first redundant signal line connected to a row of the dummy pixel circuits and a second redundant signal line connected to a column of the dummy pixel circuits; and
the power signal line comprises a first power signal line and a second power signal line;
wherein the first power signal line is distributed around the display region, there are two second power signal lines, and the two second power signal lines are distributed toward two opposite second sides of the display region, the second side of the display region being a side of the display region adjacent to the first side; and
both ends of the first redundant signal line are electrically connected to the first power signal line; and both ends of the second redundant signal line are electrically connected to the first power signal line, or both ends of the second redundant signal line are electrically connected to the two second power signal lines respectively.

17. The display panel according to claim 5, wherein the first electrode layer further comprises a connection electrode configured to connect two adjacent ones of the dummy electrodes, and the dummy electrodes are electrically connected to the power signal line.

18. The display panel according to claim 1, wherein the display region comprises a plurality of pixel subregions, wherein one of the pixel subregions comprises at least two of the effective pixel openings distributed side by side, and the effective light-emitting portions in at least two of the effective pixel openings in one of the pixel subregions are of a same type.

19. A display apparatus, comprising a power supply assembly and a display panel electrically connected to the power supply assembly, wherein the display panel is a display panel having a display region and a non-display region at a periphery of the display region, and comprising:
- a substrate;
- a first electrode layer on a side of the substrate, wherein the first electrode layer comprises a plurality of first electrodes that are independently distributed;
- a pixel defining layer on a side of the first electrode layer distal from the substrate, wherein the pixel defining layer is provided with a plurality of effective pixel openings in the display region and a plurality of auxiliary dummy openings in the non-display region, wherein the plurality of effective pixel openings are in a one-to-one correspondence with the plurality of first electrodes, and an orthographic projection of the effective pixel opening on the substrate falls into an orthographic projection of a corresponding first electrode on the substrate;
- a light-emitting layer, wherein the light-emitting layer comprises effective light-emitting portions in the effective pixel openings and auxiliary dummy portions in the auxiliary dummy openings;
- a second electrode layer on a side of the light-emitting layer distal from the substrate; and
- a peripheral conductive structure in the non-display region, wherein an orthographic projection of the peripheral conductive structure on the substrate overlaps an orthographic projection of the auxiliary dummy opening on the substrate.

20. The display apparatus according to claim 19, further comprising an optical lens on a light exit side of the display panel, wherein the optical lens is provided with a plurality of microlenses.

* * * * *